United States Patent
Aoki et al.

(10) Patent No.: US 7,356,742 B2
(45) Date of Patent: Apr. 8, 2008

(54) METHOD AND APPARATUS FOR TESTING A MEMORY DEVICE IN QUASI-OPERATING CONDITIONS

(75) Inventors: Hideyuki Aoki, Takasaki (JP); Takeshi Wada, Akishima (JP); Masaaki Namba, Sayama (JP); Noboru Uchida, Kodaira (JP); Shigeki Katsumi, Hinode (JP); Yuji Wada, Kamisato (JP); Masaaki Mochiduki, Honjo (JP)

(73) Assignees: Renesas Technology Corp., Tokyo (JP); Hitachi High-Technologies Corporation, Tokyo (JP)

( * ) Notice: Subject to any disclaimer, the term of this patent is extended or adjusted under 35 U.S.C. 154(b) by 250 days.

(21) Appl. No.: 11/107,896

(22) Filed: Apr. 18, 2005

(65) Prior Publication Data

US 2005/0193274 A1   Sep. 1, 2005

Related U.S. Application Data

(63) Continuation of application No. 09/736,282, filed on Dec. 15, 2000, now abandoned.

(30) Foreign Application Priority Data

Dec. 17, 1999   (JP) .................................. 11-358305

(51) Int. Cl.
  *G11C 29/00* (2006.01)
(52) U.S. Cl. .................................................... 714/719
(58) Field of Classification Search .................. 714/719
  See application file for complete search history.

(56) References Cited

U.S. PATENT DOCUMENTS

| 5,635,832 | A |   | 6/1997 | Ito et al. ................... 324/158.1 |
| 6,055,653 | A |   | 4/2000 | LeBlanc et al. ............. 714/718 |
| 6,055,661 | A | * | 4/2000 | Luk ............................ 714/736 |
| 6,094,733 | A |   | 7/2000 | Momohara .................. 714/718 |
| 6,499,121 | B1 |   | 12/2002 | Roy et al. .................... 714/724 |

FOREIGN PATENT DOCUMENTS

| JP | 8-212145 | 8/1996 |
| JP | 9-293397 | 11/1997 |
| WO | WO 99/01871 | * 1/1999 |

* cited by examiner

*Primary Examiner*—Shelly Chase
(74) *Attorney, Agent, or Firm*—Mattingly, Stanger, Malur & Brundidge, P.C.

(57) ABSTRACT

A memory test system can screen objects of tests accurately at low cost in quasi-operating conditions by utilizing a personal computer (PC). The system utilizes a PC tester comprising a measurement PC unit that carries a memory module to be used as reference; a signal distribution unit for distributing the signal taken out form the measurement PC unit; a plurality of performance boards (PFBs) mounted with respective objected products to be observed simultaneously by using the signals distributed by the signal distribution unit; a display panel for displaying the current status of the test that is being conducted; a power source for producing the operating voltage of the system; and a control PC for controlling the selection of test parameters and various analytical operations. The PC tester is adapted to take out the signal from the chipset LSI (large scale integrated circuit) on the PC mother board in the measurement PC unit to the individual memories on the memory module or the memory module per se and test them in quasi-operating conditions.

13 Claims, 21 Drawing Sheets

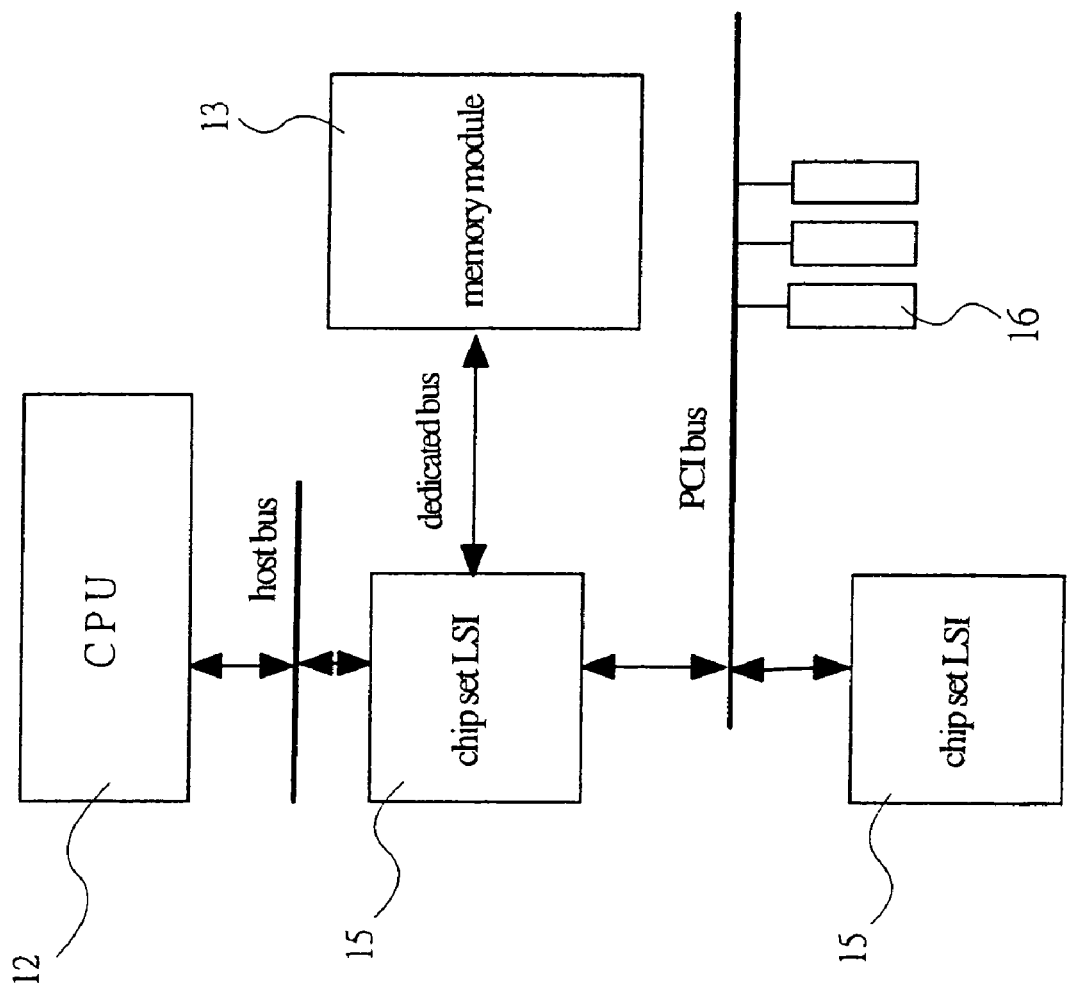

METHOD AND APPARATUS FOR TESTING A MEMORY DEVICE IN QUASI-OPERATING CONDITIONS

This is a continuation application of U.S. Ser. No. 09/736,282, filed Dec. 15, 2000 now abandoned.

TECHNICAL FIELD OF THE INVENTION

This invention generally relates to the technology of testing and manufacturing a memory device (which may be in the form of a chip or a package) and a memory module. More particularly, the present invention relates to the technology that can effectively be used for a memory test system adapted to test an object of observation in quasi-operating conditions typically by utilizing a personal computer.

BACKGROUND OF THE INVENTION

In the inventors' view, as a result of the recent technological developments for achieving a larger memory capacity, the ability of processing data having a greater bit width and a higher processing speed in the field of memory devices and memory modules, there is an ever-increasing demand for memory test systems that can cope with the above identified situation. Particularly, a memory device having a large memory capacity normally implies an increased test time and the ability of processing data having a large bit width normally signifies a reduced number of memory devices that can be tested at a time while a high processing speed refers to the requirement of the use of a higher frequency and an improvement in terms of precision and quality.

Known memory test systems for testing semiconductor memories include general purpose memory testers adapted to both analyze and test mainly individual semiconductor memories and module testers adapted to carry out a simple test only on memory modules. In other words, conventionally, a test apparatus adapted to a specific test object has to be selectively used.

SUMMARY OF THE INVENTION

As a result of a series of analytical studies on known general purpose memory testers and module testers, the inventor of the present invention came to find as below. For example, general purpose memory testers are highly functional but costly and it is difficult for them to produce quasi-operating conditions by means of hardware and/or software because their functions are limited and the operating conditions quickly change with time. On the other hand, module testers are less costly but limited in terms test conditions and test types and hence they are poorly convenient.

Meanwhile, manufacturers of personal computers and other data processing apparatus comprising memory devices and/or memory modules are experiencing inconveniences including that read/write operations do not proceed properly depending on the type and format and the supplier of the memory devices and/or the memory modules when randomly accessing a memory space under the control of a control circuit such as a CPU, although the memory devices and/or the memory modules must have passed a test. Thus, what the manufacturers are experiencing in reality is that the conventional testers have limits in terms of selecting good memory devices and memory modules and quasi-operating conditions have to be prepared when testing them.

In view of the above circumstances, it is therefore an object of the present invention to provide a technique of testing and manufacturing memory devices (which may be in the form of a chip of a package) or memory modules that can highly reliably test them and select good ones in an inexpensive way.

The above and other objects and novelty features of the invention will become apparent in the following description made by referring to the accompanying drawings.

Some of the various aspects of the present invention will be summarily described below.

In an aspect of the invention, there is provided a method of testing a memory device by using a data processing unit having a memory device mounted thereon, said method comprising a step of supplying said memory device to be tested with a signal to be supplied said memory device and a step of checking the relationship between output signals produced from said memory device and output signals produced from said memory device to be tested.

With the above method of testing a memory device, a plurality of said memory devices to be tested may be tested and said signals may be supplied in parallel to said plurality of memory devices to be tested. With the above method of testing a memory device, said data processing unit may have a control circuit connected to said memory device, said control circuit controlling an operation of said memory device. With the above method of testing a memory device, said checking step is adapted to check said output signals for agreement/disagreement. With the above method of testing a memory device, said signals to be supplied to said memory device may include an address signal, a data signal, a clock signal and a control signal. With the above method of testing a memory device, said signals supplied to said memory device to be tested may be transferred by means of a pipeline system. When said signals supplied in parallel to said plurality of memory devices to be tested may also be transferred by means of a pipeline system. Additionally, when a plurality of memory devices are to be tested, said signals supplied by means of said pipeline system may be distributed in a plurality of stages and supplied in parallel to said plurality of memory devices to be tested.

In another aspect of the invention, there is provided a method of manufacturing a memory device comprising a step of forming a semiconductor device having a memory, a step of supplying said memory of said semiconductor device signals to be supplied to a first memory mounted on a data processing unit and checking the relationship between signals output from said first memory and signals output from said memory of said semiconductor device.

With the above method of manufacturing a memory device, a plurality of said memories used in said step of forming said semiconductor device may be formed and said signals to be supplied to said first memory may be supplied in parallel to said plurality of memories used in said step of forming said semiconductor device. Said data processing unit may be coupled to said first memory and has a control circuit for controlling an operation of said first memory. Said checking step may be adapted to check said output signals for agreement/disagreement. Said signals to be supplied to said first memory may include an address signal, a data signal, a clock signal and a control signal.

In still another aspect of the invention, there is provided an apparatus for testing a memory device, said apparatus comprising a socket to be mounted with a memory device to be tested, a terminal supplied from a data processing unit mounted with a memory with signals to be supplied to the memory and output signals from said memory and a control section for determining relationship between output signals from said socket and the output signals from said memory. The apparatus for testing a memory device may comprise a first board for carrying said socket to be mounted with said memory device to be tested and a second board adapted to carrying a plurality of said first boards, distribute the signals to be supplied to said memory and supply the signals to said memory device to be tested. The apparatus for testing a memory device may comprise a plurality of types of said first boards to accommodate said memory device to be tested. Said memory device to be tested may be a TSOP or a TCP.

In said apparatus for testing a memory device, a plurality of said memory devices to be tested may be tested and said signals to be supplied to said memory are supplied in parallel to said plurality of memory devices to be tested. Said data processing unit may be coupled to said memory and comprise a control connector for controlling an operation of said memory. Said control circuit may be adapted to check said signals for agreement/disagreement. Said signals to be supplied to said memory may include an address signal, a data signal, a clock signal and a control signal. Said apparatus for testing a memory device may further comprise a substrate for taking out the signal from the memory mounted on said data processing unit and supplying it to said terminal.

In still another aspect of the invention, there is provided a method of testing a memory module by using a data processing unit mounted with a memory module having a plurality of memory devices, said method comprising a step of supplying a memory device to be tested with signals to be supplied to said memory module and a step of checking relationship between output signals from said memory module and the output signals from said memory device to be tested. Said memory module may be a DIMM.

With the method of testing a memory module, said signals to be supplied to said memory module are signals to be supplied to a first memory device of said plurality of memory devices and said output signals from said memory module are the output signals from a second memory device of said plurality of memory devices. Said first memory device and said second memory device may be a same memory device.

With the method of testing a memory module, a plurality of said memory devices to be tested may be tested and said signals to be supplied to said memory module may be supplied in parallel to said plurality of memory devices to be tested. Said data processing unit may be coupled to said memory module and have a control circuit for controlling the operation of said memory module. Said checking step may be adapted to check said output signals for agreement/disagreement. Said signals to be supplied to said memory module may include an address signal, a data signal, a clock signal and a control signal. Said memory device to be tested may be one of a plurality of memory devices mounted on memory module.

In still another aspect of the invention, there is provided a method of manufacturing a memory module comprising a step of preparing a memory device, a step of supplying said memory device from a data processing unit mounted with a first memory with signals to be supplied to the first memory and checking relationship between output signals from said first memory and the output signals from said memory device and a step of forming the memory module by mounting on a substrate said memory device checked for the relationship in the preceding step. Said memory module may be a DIMM.

With said method of manufacturing a memory module, a plurality of said memory devices may be prepared and said signals to be supplied to said first memory may be supplied in parallel to said plurality of memory devices. Said data processing unit may be coupled to said first memory and have a control circuit for controlling the operation of said memory module. Said checking step may be adapted to check said output signals for agreement/disagreement. Said signals to be supplied to said first memory may include an address signal, a data signal, a clock signal and a control signal.

In still another aspect of the invention, there is provided an apparatus for testing a memory module, said apparatus comprising a board to be provided with a memory module having a plurality of memory devices, a terminal supplied from a data processing unit mounted with said memory module with signals to be supplied to the memory module and with output signals of said memory and a control section for supplying said board with signals to be supplied to said memory module, and for determining relationship between output signals from said board and output signals from said memory module. Said memory module may be a DIMM.

In said apparatus for testing a memory module, said signals to be supplied to said memory module are signals to be supplied to a first memory device of said plurality of memory devices and said output signals from said memory module are output signals from a second memory device of said plurality of memory devices. Said first memory device and said second memory device may be a same memory device.

In said apparatus for testing a memory module, said signals to be supplied to said memory module may be supplied in parallel to said plurality of memory devices. Said data processing unit may be coupled to said memory module and have a control circuit for controlling the operation of said memory module. Said control section may be adapted to check said output signals for agreement/disagreement. Said signals to be supplied to said first memory may include an address signal, a data signal, a clock signal and a control signal. Said apparatus for testing a memory module may be adapted to define a test unit on said board. In said apparatus for testing a memory module, one of said plurality of memory devices mounted on said memory module to be provided on said board may be tested.

In a further aspect of the invention, there is provided a method of manufacturing a computer comprising a step of preparing a mother board carrying a CPU, a socket to be mounted with a memory device to be tested and a control circuit connected to said CPU and said socket, a step of preparing a memory module having a plurality of memory devices and a step of arranging said memory module on said socket, said memory devices of said memory module satisfying a predetermined relationship in a test step, said test step being adapted to supply signals from a data processing unit mounted by a first memory to said memory devices, said signal being to be supplied to said first memory, and to check relationship between output signals from a first memory and output signals from said memory devices. Said memory module may be a DIMM.

In said apparatus for manufacturing a computer, said signals to be supplied to said first memory may be supplied in parallel to said plurality of memory devices. Said data processing unit may be coupled to said first memory and have a control circuit for controlling an operation of said first memory. Said checking step may be adapted to check said output signals for agreement/disagreement. Said signals to be supplied to said first memory may include an address signal, a data signal, a clock signal and a control signal.

Thus, with the method of testing a memory device, the method of manufacturing a memory device, the apparatus for testing a memory device, the method of testing a memory module, the method of manufacturing a memory module, the apparatus for testing a memory module and the method of manufacturing a computer according to the invention, a memory device or a memory module, whichever appropriate, can be tested in quasi-operating conditions. Additionally, according to the invention, it is now possible to realize a high performance test apparatus at low cost by utilizing a personal computer comprising a data processing unit. Still additionally, according to the invention, it is now possible to test a memory device and a memory module. Still additionally, according to the invention, it is now possible to handle, simply by selectively using a personal computer for testing, personal computers expected to have only a short service life because of early model changes. Still additionally, according to the invention, it is now possible to test a memory device or a memory module including the performance of the related peripheral circuits of the personal computer on which it is to be mounted and the influence of processing operations of the personal computer using programs that could hitherto give rise to problems when mounting it on the personal computer.

Some typical advantages that the present invention can provide include the following.

(1) Since the relationship between the output signal of the memory device or the memory module to be used as reference and the output signal of the memory device or the memory module, whichever appropriate, to be tested, the memory chip (in the form of a chip), the unit product (in the form of a package), the memory module or the personal computer can be tested in quasi-operating conditions that are very close to the actual operating conditions.

(2) Since a personal computer or the like comprising a data processing unit having a control circuit for controlling the operation of the memory device or the memory module to be used as reference is utilized, it is possible to realized a high performance test apparatus at low cost.

(3) Since the data processing unit comprises a socket or the like to which the memory device or the memory module to be tested is to be mounted and the socket may be selectively used, memory chips, unit products, memory modules and personal computers can be tested by means of a same test apparatus.

(4) It is possible to handle personal computers expected to have only a short service life because of early model changes simply by selectively using a personal computer for testing comprising a data processing unit mounted by a memory device or a memory module to be used as reference.

(5) It is possible to test a memory device or a memory module in quasi-operating conditions, including the performance of the related peripheral circuits of the personal computer on which it is to be mounted and the influence of processing operations of the personal computer using programs that could hitherto give rise to problems when mounting it on the personal computer.

(6) Since the signal supplied to the memory device or the memory module to be used as reference is supplied in parallel to a plurality of memory devices, a number of memory chips, unit products, memory modules or personal computers can be tested simultaneously.

(7) Since a test method of checking the output signal of the memory device or the memory module to be used as reference and the output signal of the memory chip or the memory module, whichever appropriate, to be tested for agreement/disagreement is applied to the step of sorting memory chips, unit products or memory modules, the step of carrying out an acceptance test on memory chips or unit products and/or the step of carrying out an acceptance inspection on memory modules, the high speed tester that has hitherto been used for them can be replaced by a test apparatus according to the invention to reduce the investment for the test, the inspection and the manufacturing equipment.

(8) Memory chips, unit products and memory modules can be sorted under quasi-operating conditions to consequently improve the quality of memory chips, unit products, memory modules and personal computers, since good products/no good products are sorted by checking the output signal of the memory device or the memory module to be used as reference and the output signal of the memory chip, the unit product, the memory module, whichever appropriate, to be tested for agreement/disagreement.

BRIEF DESCRIPTIONS OF THE DRAWINGS

FIG. 3 is a schematic block diagram of the PC mother board of the embodiment of memory test system of FIG. 1.

DESCRIPTION OF THE PREFERRED EMBODIMENTS

Now, a preferred embodiment of the present invention will be described below by referring to the accompanying drawings. Throughout the drawings, same members are denoted respectively by the same reference symbols and will not be described repeatedly.

Figure 7A:
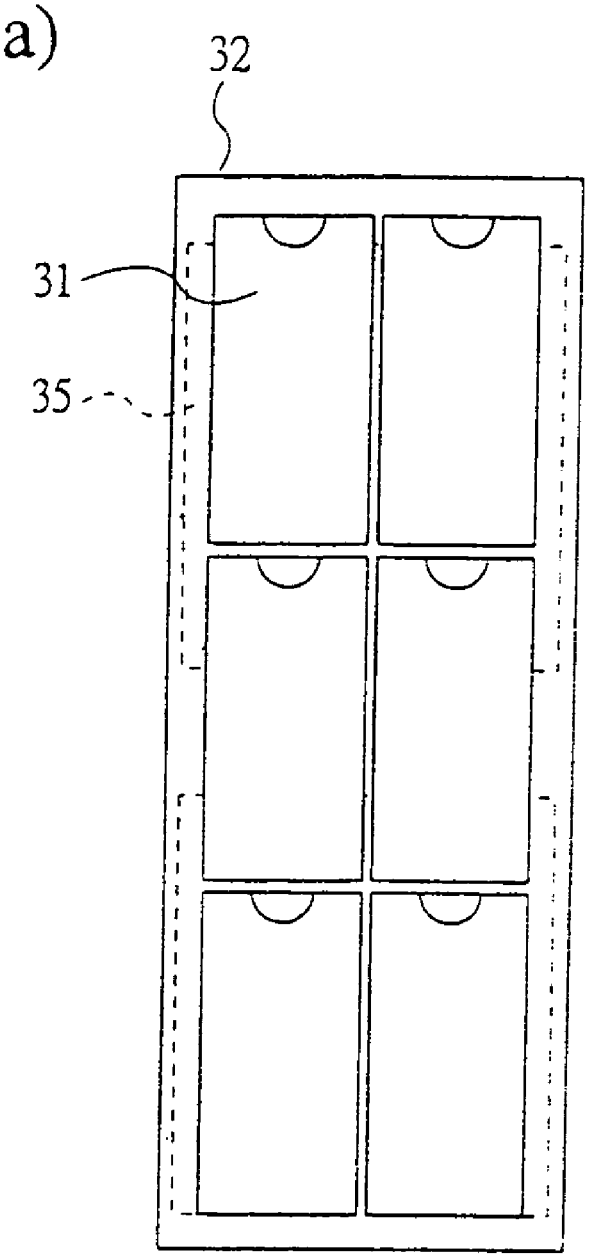
FIG. 7(a) is a schematic plan view and FIG. 7(b) a schematic lateral view of the socket board of the PFB (for a TCP) of the embodiment of memory test system of FIG. 1.
Figure 7B:
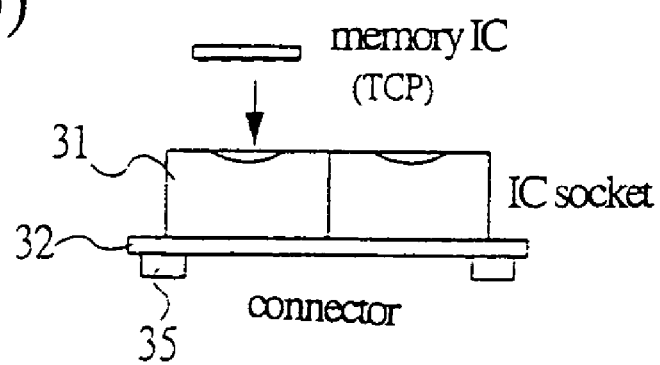
Figure 8:
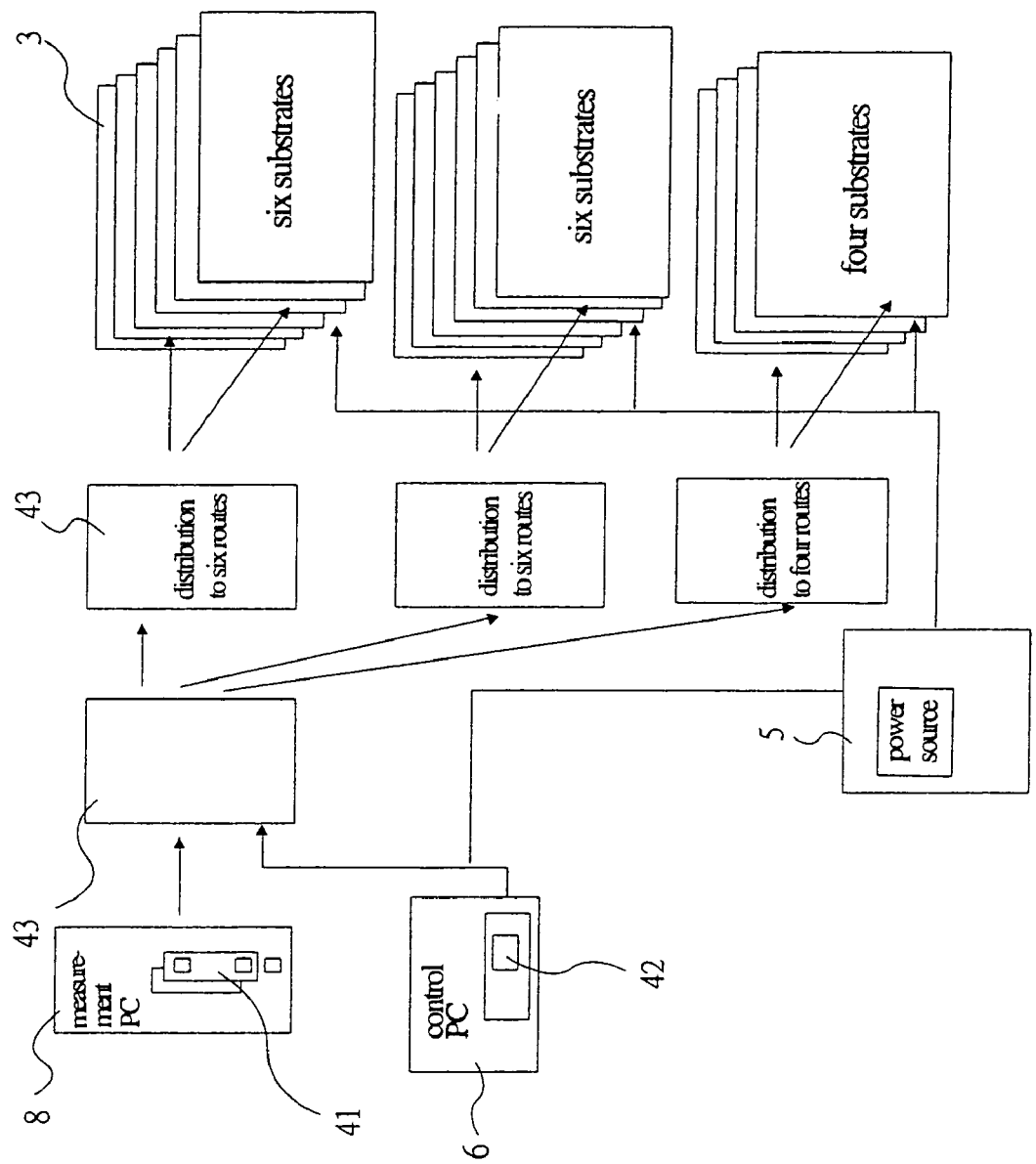
FIG. 8 is a schematic illustration of the signaling system of the embodiment of memory test system of FIG. 1.
Figure 9:
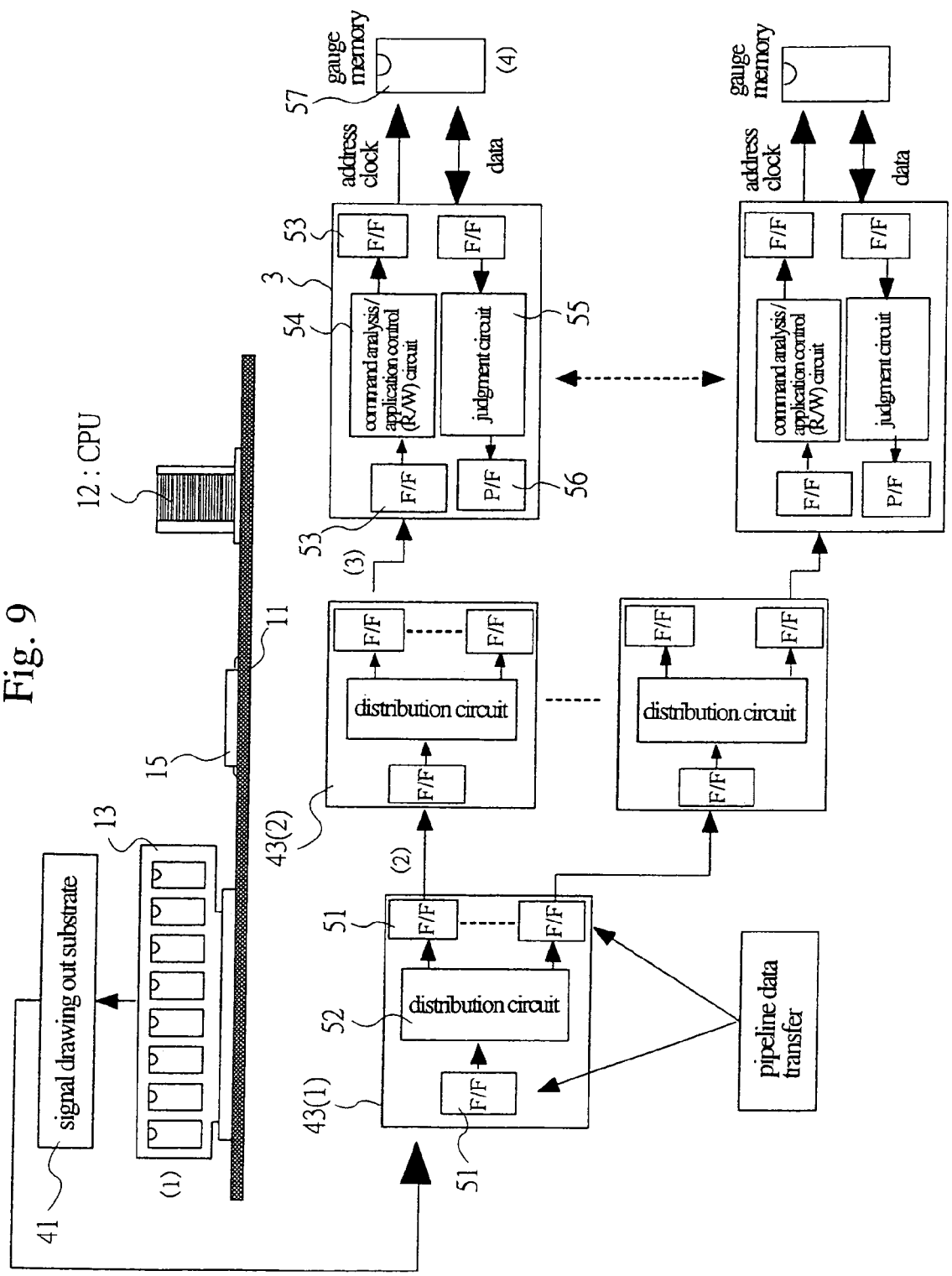
FIG. 9 is a schematic illustration of the signaling system of the embodiment of memory test system of FIG. 1 when testing alone a memory.
Figure 10:
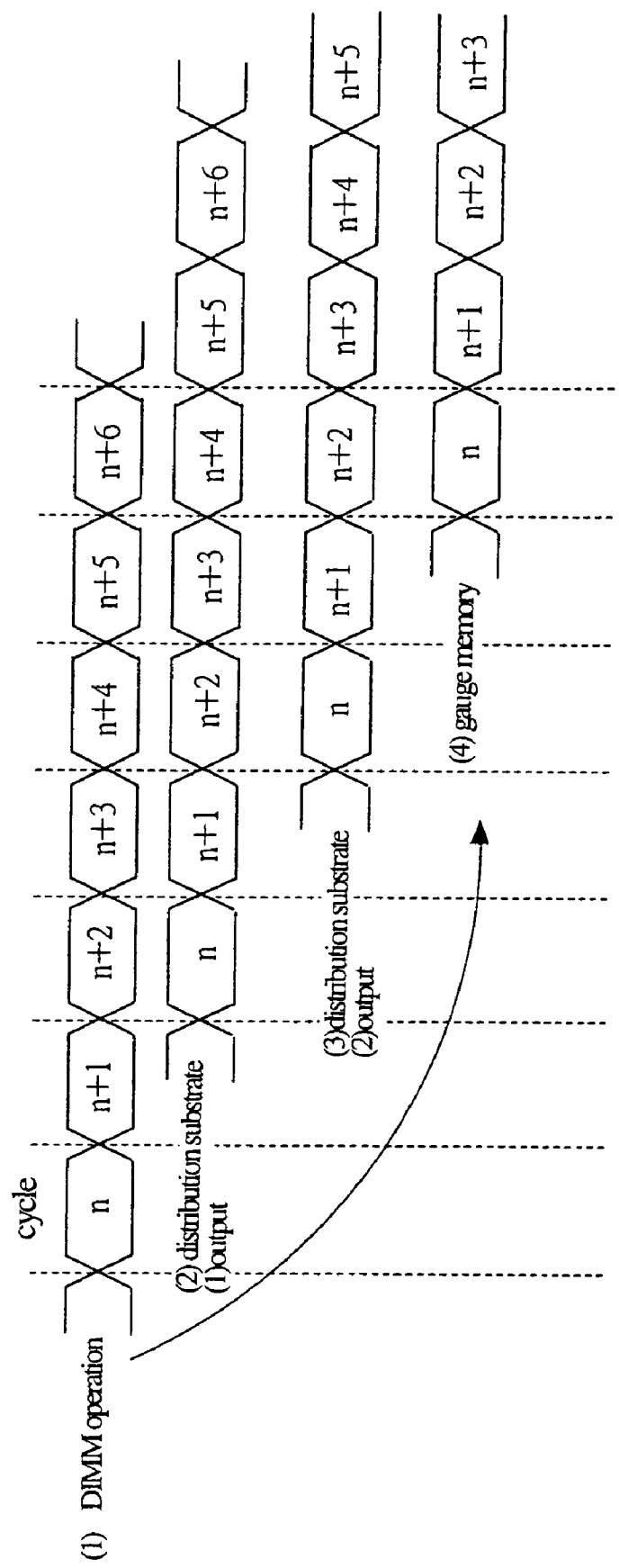
FIG. 10 is a timing chart of the pipeline system to be used for the embodiment of memory test system of FIG. 1.
Figure 11:
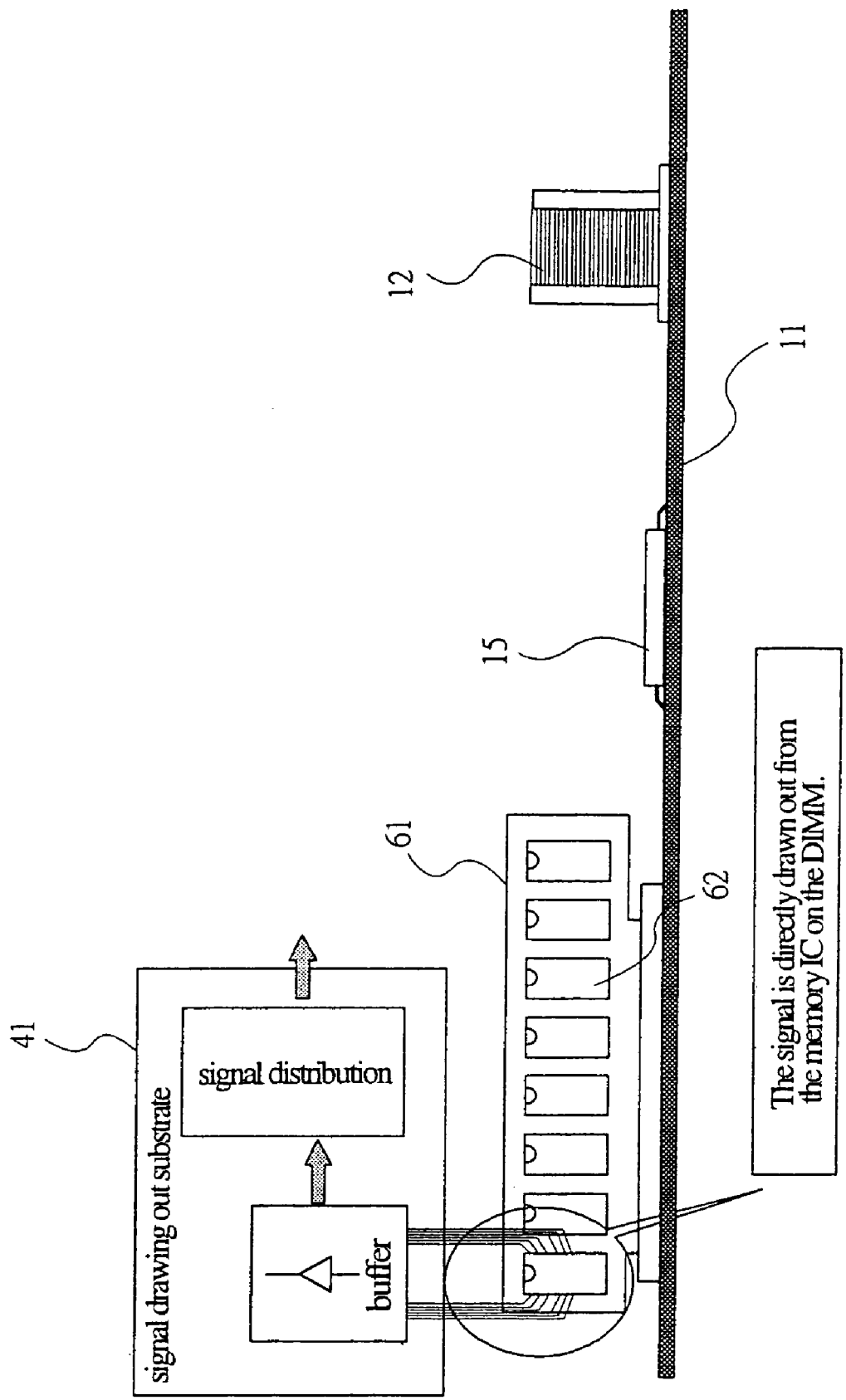
FIG. 11 is a schematic illustration of the signal drawing out method to be used when testing alone a memory by the embodiment of memory test system of FIG. 1.
Figure 15:
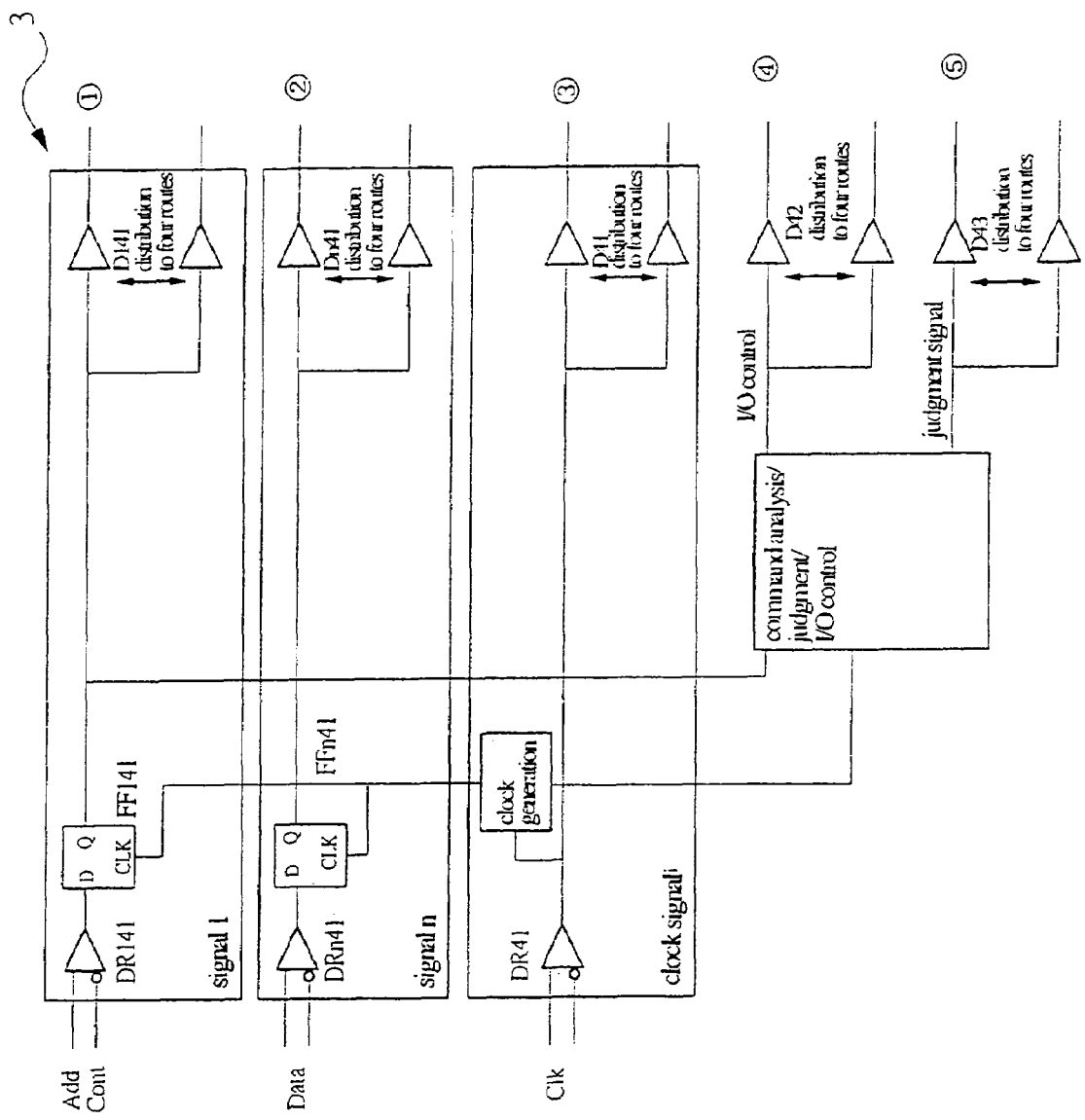
FIG. 15 is a schematic block diagram of the PFB (distributing section) of the embodiment of memory test system of FIG. 1.
Figure 16:
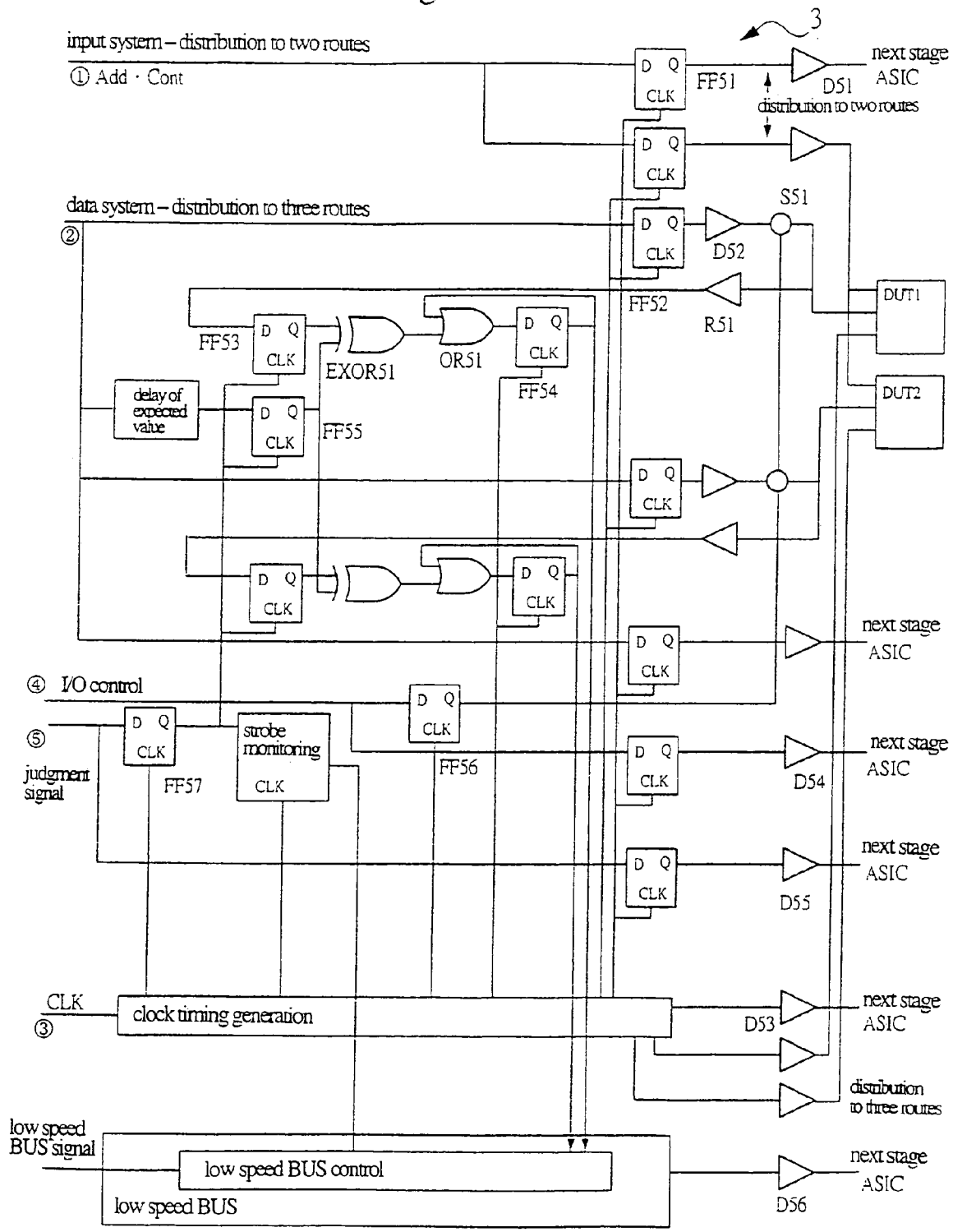
FIG. 16 is a schematic block diagram of the PFB (socket section) of the embodiment of memory test system of FIG. 1.
Figure 17:
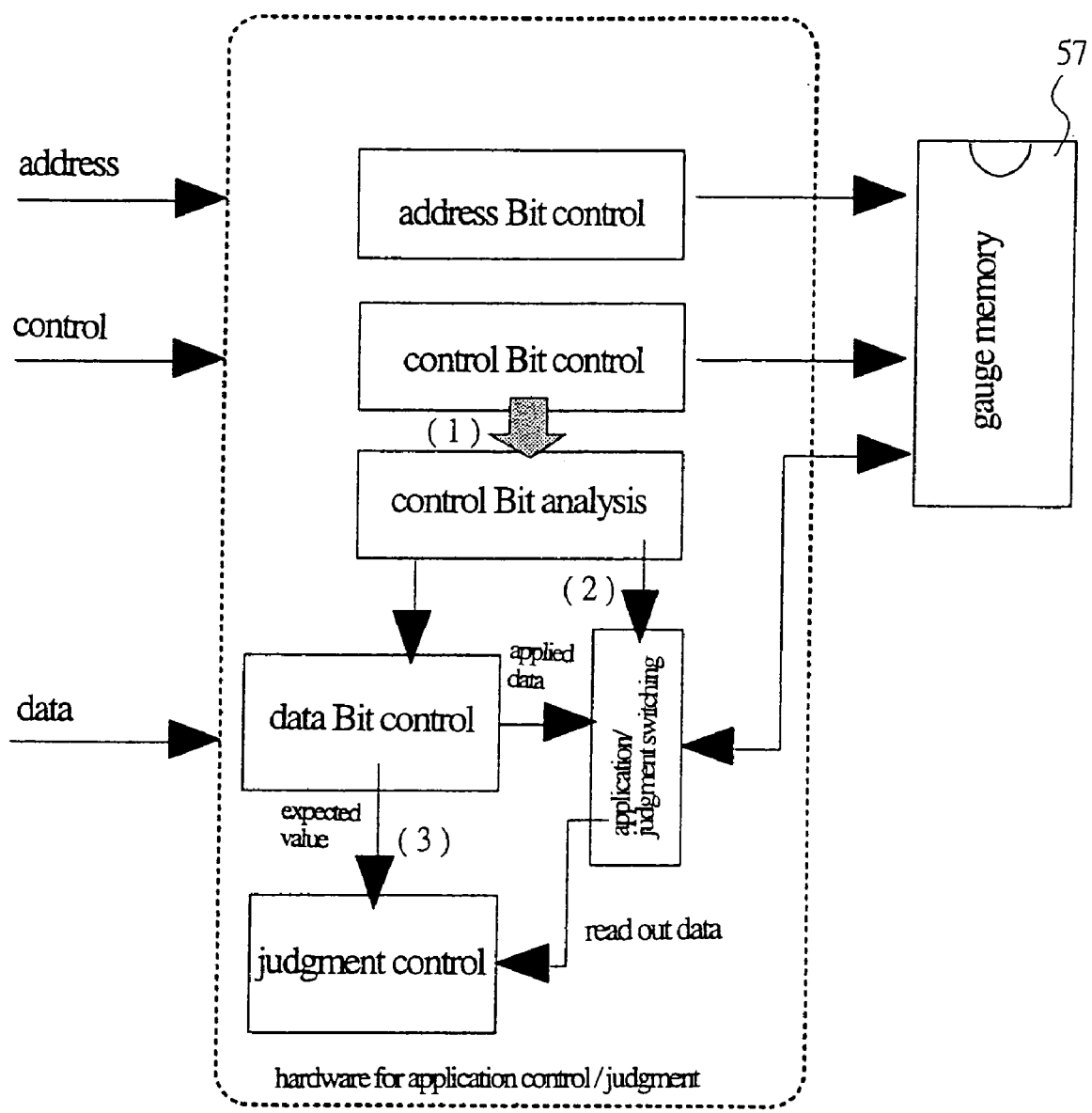
FIG. 17 is a schematic illustration of the read/write switching judgment method to be used for the embodiment of memory test system of FIG. 1.
Figure 18:
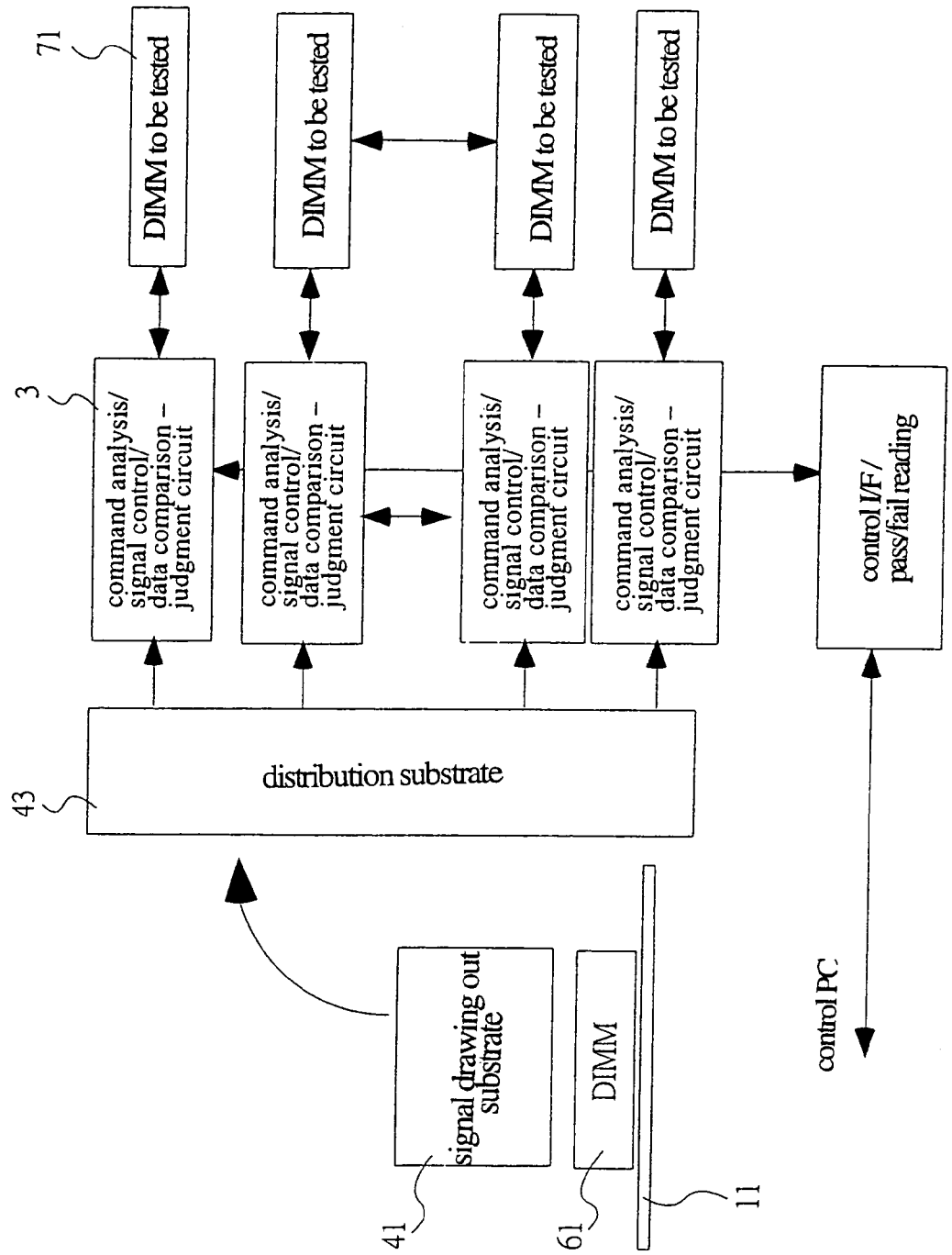
FIG. 18 is a schematic illustration of the signaling system of the embodiment of memory test system of FIG. 1, when testing a memory module.
Figure 19:
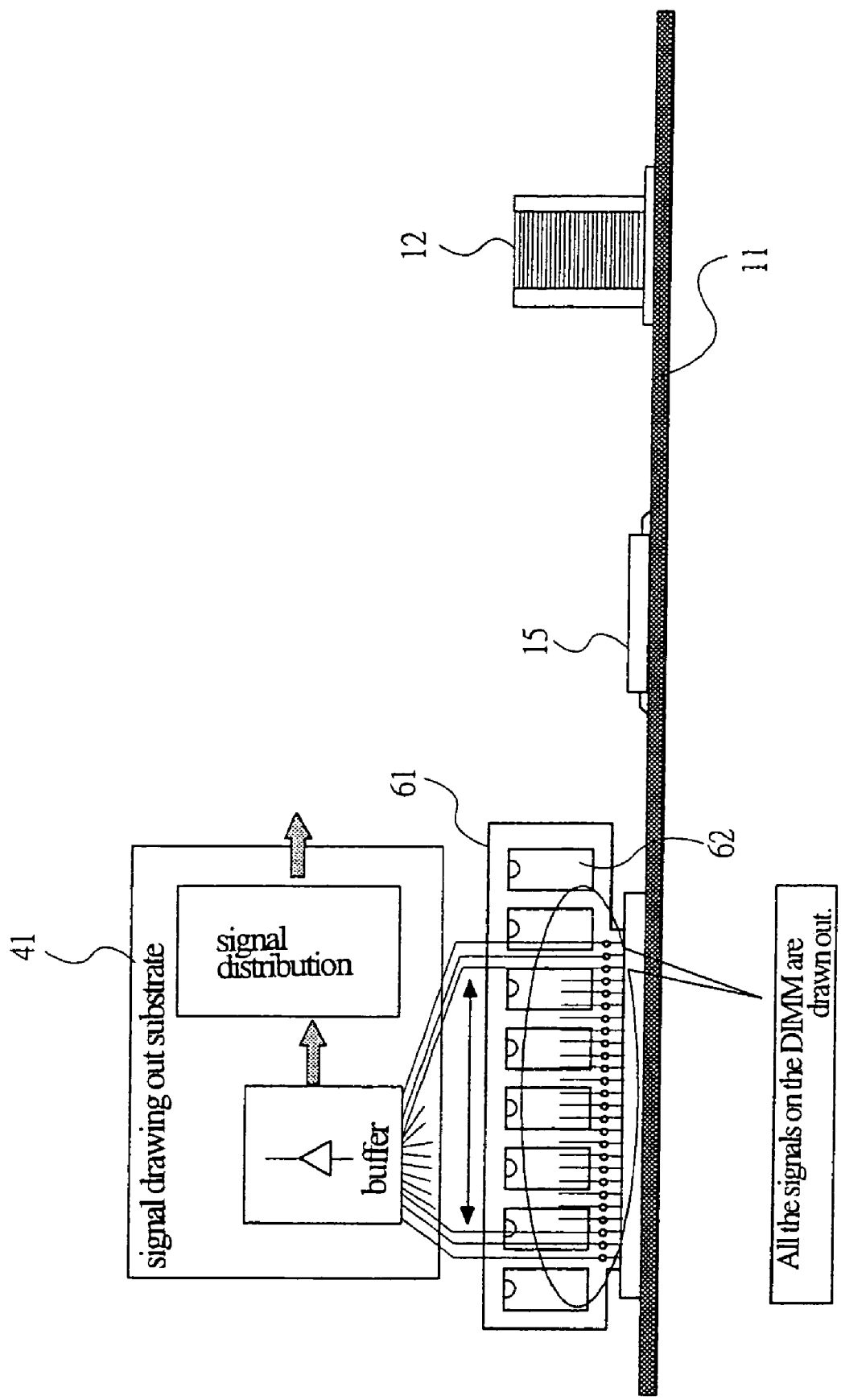
FIG. 19 is a is a schematic illustration of the signal drawing out method to be used when testing a memory module by the embodiment of memory test system of FIG. 1.
Figure 20:
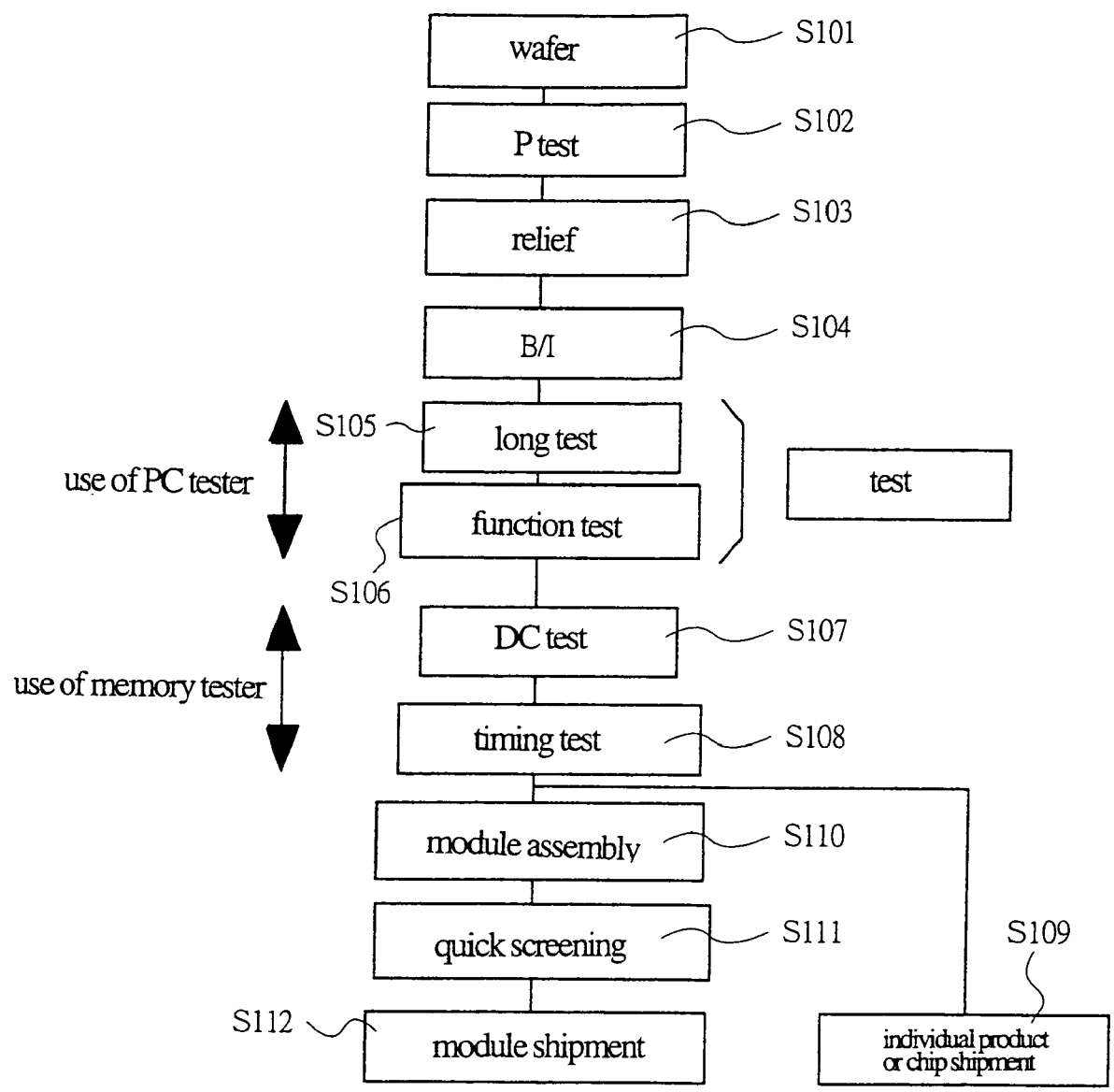
FIG. 20 is a flow chart of the testing step of the operation of the embodiment of memory test system of FIG. 1.
Figure 21:
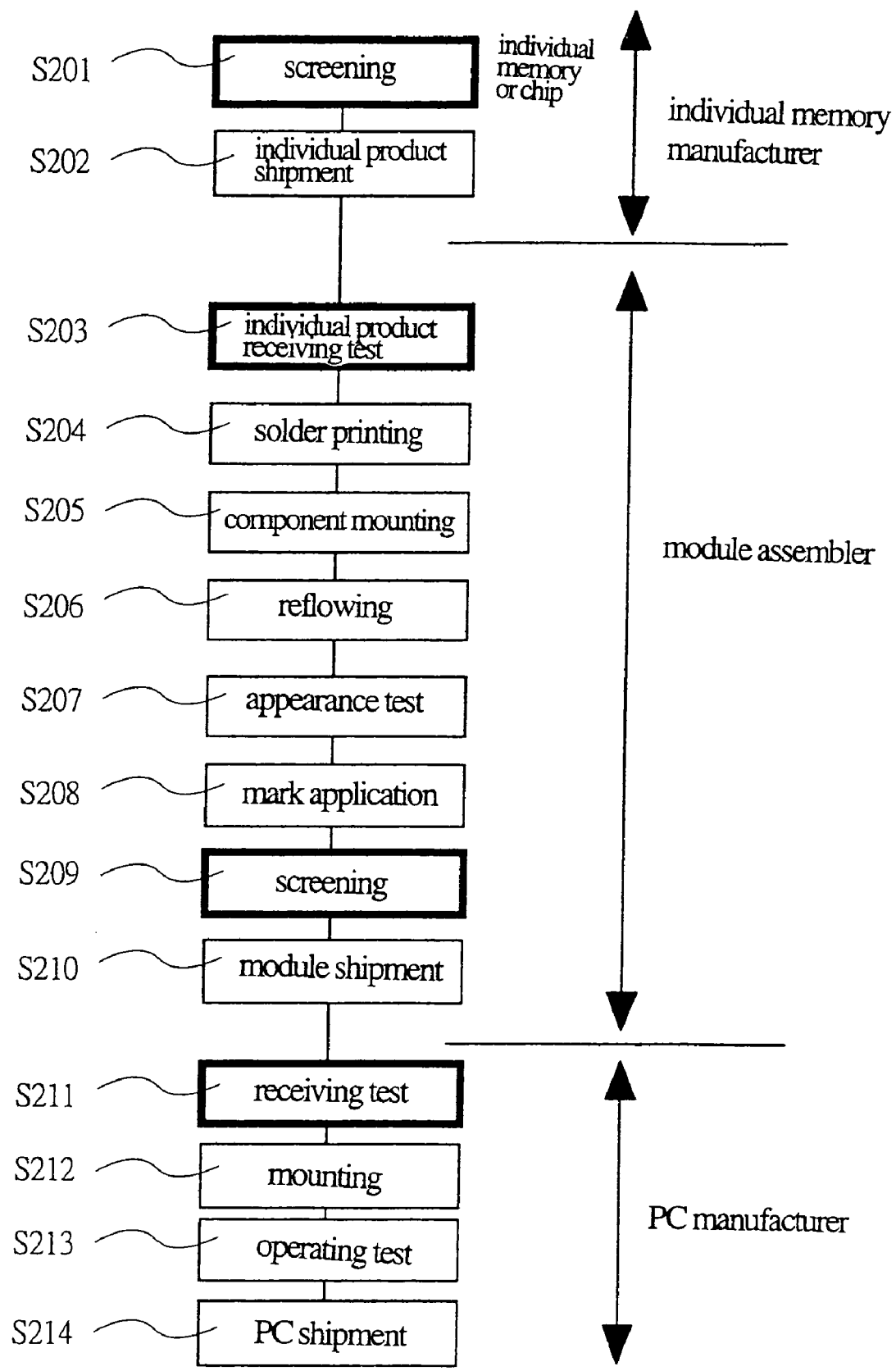
FIG. 21 is a flow chart of the step of mounting a module and a product of the operation of the embodiment of memory test system of FIG. 1.

FIG. 1 schematically illustrates the embodiment of memory test system according to the invention, showing its appearance and FIGS. 2 through 8 are schematic illustrations of the different components of the embodiment of memory test system. FIGS. 9 through 11 are schematic illustrations of the embodiment of memory test system when testing alone a memory and FIGS. 12 through 16 are schematic block diagrams of the respective substrates of the embodiment of memory test system. FIG. 17 is a schematic illustration of the read/write switching judgment method to be used for the embodiment of memory test system and FIGS. 18 and 19 are schematic illustration of the signaling system of the embodiment of memory test system when testing a memory module. FIG. 20 is a flow chart of the testing step of the operation of the embodiment of memory test system and FIG. 21 is a flow chart of the step of mounting a module and a product of the operation of the embodiment of memory test system.

Figure 1C:
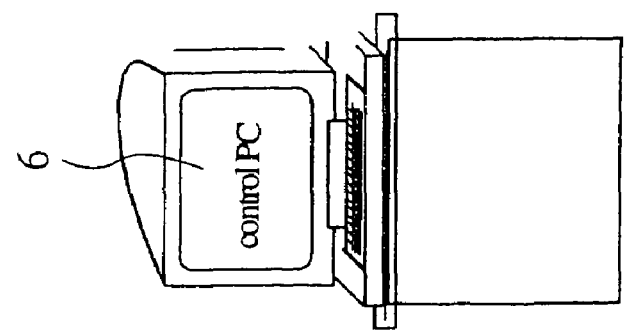
FIG. 1(a) shows a schematic front view of an embodiment of memory test system according to the present invention, FIG. 1(b) a schematic lateral view of the memory test system of FIG. 1(a) and FIG. 1(c) a schematic perspective view of the memory test system of FIG. 1(a).
Figure 1B:
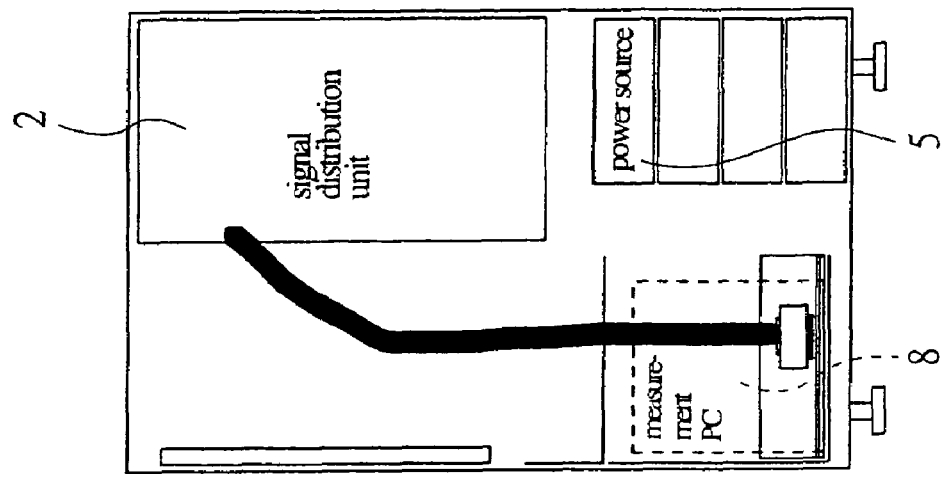
Figure 1A:
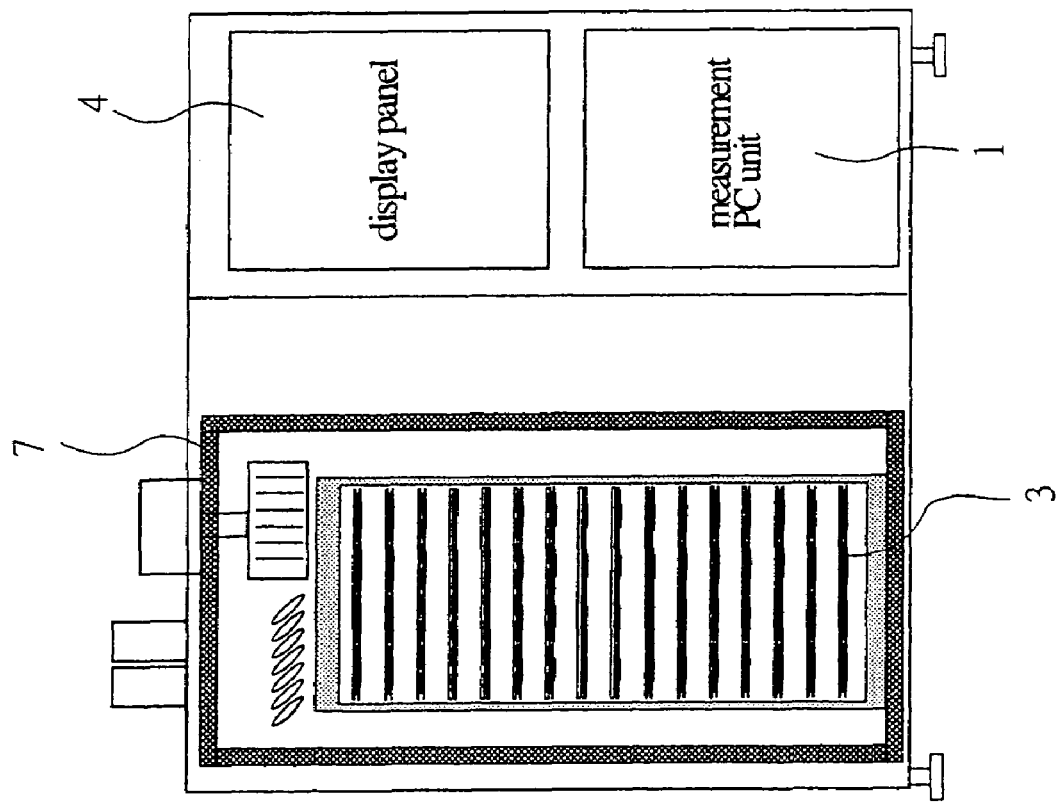

Firstly, the configuration of the embodiment of memory test system according to the invention will be described by referring to FIG. 1. FIG. 1(a) shows a schematic front view of an embodiment of memory test system according to the present invention and FIG. 1(b) shows a schematic lateral view of the memory test system, whereas FIG. 1(c) shows a schematic perspective view of the memory test system. This embodiment of memory test system is a PC tester that is adapted to utilize personal computers and comprises a measurement PC unit 1 that carries a memory module to be used as reference; a signal distribution unit 2 for distributing the signal taken out of the measurement PC of the measurement PC unit 1; a plurality (herein, 16 pieces) of PFBs (performance boards) 3 mounted by respective objects of observation to be observed simultaneously by using the signal distributed by the signal distribution unit 2; a display panel 4 for displaying the current status of the test that is being conducted; a power source 5 for producing the operating voltage of the system and a control PC 6 for controlling the selection of test parameters and various analytical operations.

In the PC tester, the measurement PC unit 1, the signal distribution unit 2, the PFBs 3, the display panel 4 and the power source 5 are contained in a cabinet and only the control PC 6 is separated from the cabinet. The PFBs 3 are housed in a constant temperature tank 7 for producing actual operating conditions which is arranged to the left in the cabinet as viewed from the front side while the display panel 4 and the measurement PC unit 1 are located respectively upper right and lower right in the cabinet. The signal distribution unit 2 and the power source 5 are arranged respectively behind the display panel 4 and the measurement PC unit 1.

Figure 2:
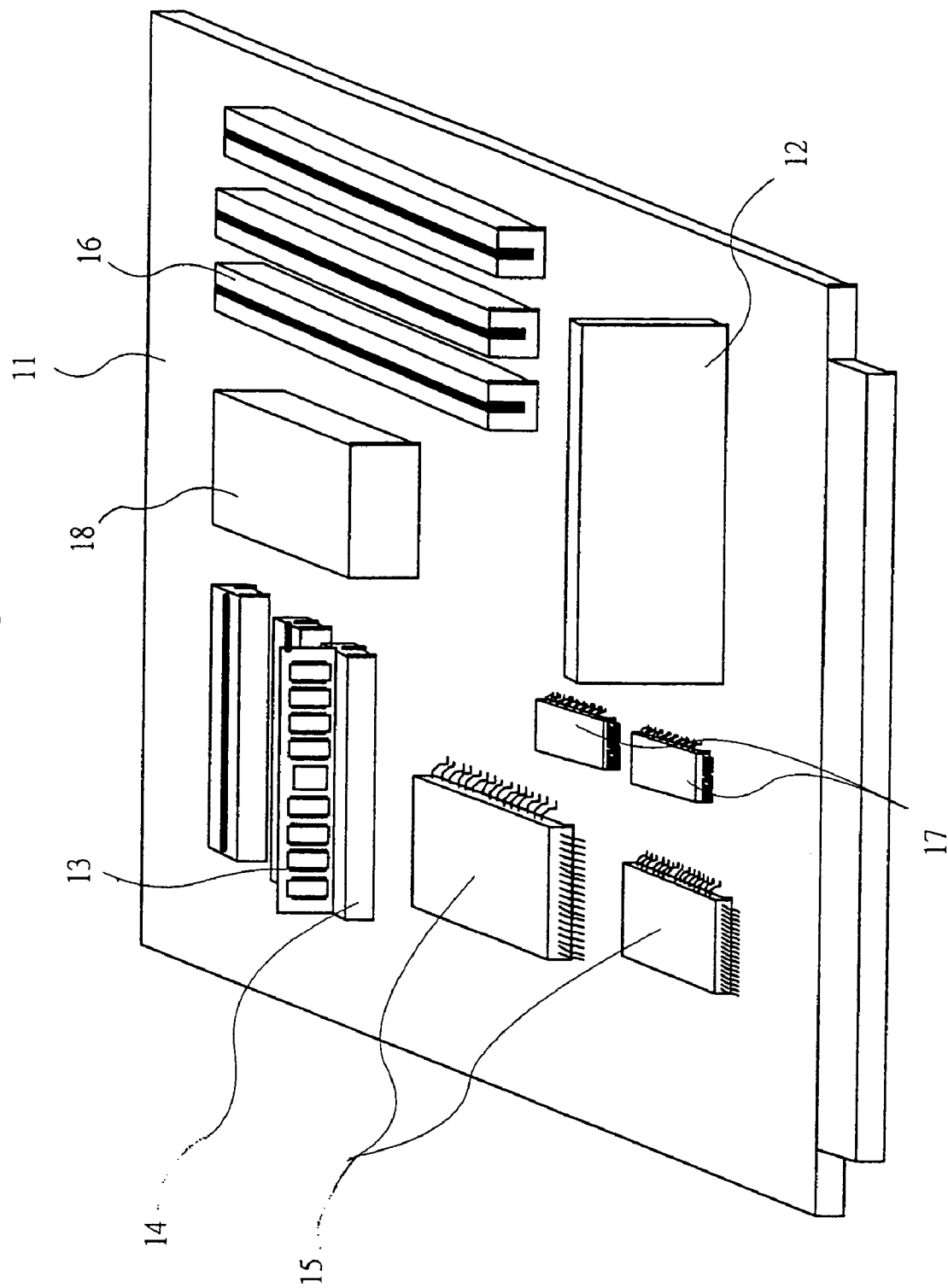
FIG. 2 is a schematic perspective view of the PC mother board of the embodiment of memory test system of FIG. 1.

The measurement PC unit 1 carries a measurement PC 8 in the inside, which measurement PC 8 contains therein a data processing unit mounted with a memory module to be used as reference and, as shown in FIG. 2, typically comprises a CPU 12; memory slots 14 to be provided with a memory modules 13; a chip set LSI 15 that is a control circuit connected to both the CPU 12 and the memory slot 14; PCI slots 16 for interfaces; secondary cache memories 17 and a power source 18 arranged on the main surface of a PC mother board 11. The memory module 13 exchanges signals with the CPU 12 under the control of the memory controller LSI called as chip set LSI 15. Thus, the chip set LSI 15 practically controls the operation of the memory module 13 for assigning addresses and also writing data to and reading data from the memory module 13. In other words, a test can be conducted in quasi-operating conditions by taking out the signal transmitted from the chip set LSI 15 to a single memory of the memory module 13.

On the PC mother board 11, the chip set LSI 15 is typically connected to the CPU 12 by way of a host bus and to the memory module 13 by way of a dedicated bus. The chip set LSI 15 is also connected to the PCI slots 16 by way of a PCI bus. Generally, the chip set LSI 15 receives an instruction for reading data from the CPU 12, decodes the address contained therein so as to be able to access the memory module 13 and sends the decoded address to the memory module 13. The read out data is then sent from the memory module 13 to the CPU 12 by way of the chip set LSI 15. On the other hand, the data transmitted from the external device that is connected to the PCI slot 16 is forwarded to the chip set LSI 15 by way of the PCI bus and then decoded and written to an address of the memory module 13.

The signal distribution unit 2 operates as means for receiving the signal taken out from the measurement PC 8 that is mounted with the memory module 13 to be used as reference and distributing it to the PFBs 3. The signal taken out from the memory module 13 is buffered by the signal drawing-out substrate and sent to the PFBs 3 by way of the distribution board.

Figure 4A:
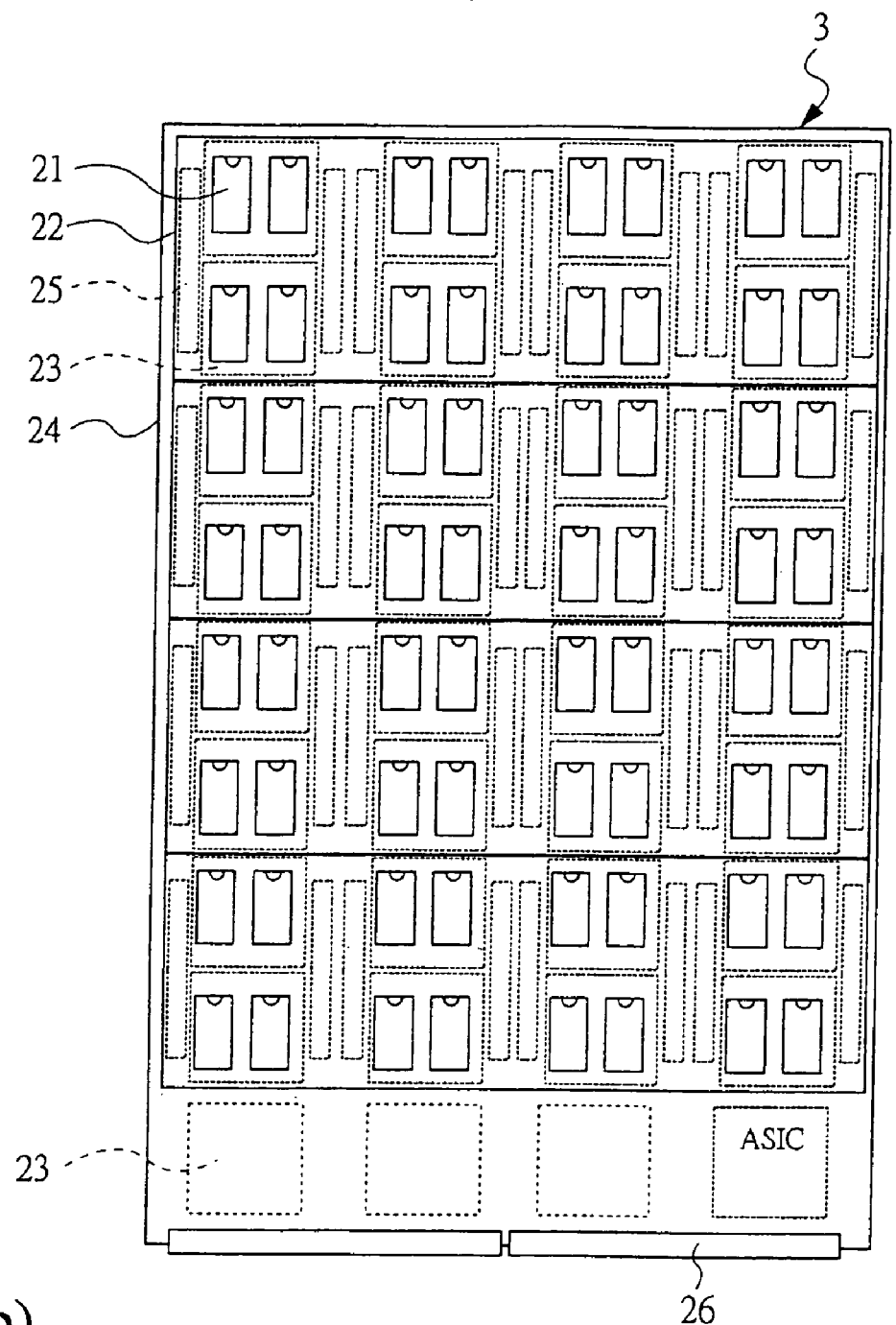
FIG. 4(a) is a schematic plan view and FIG. 4(b) is a schematic lateral view of the PFB (for a TSOP) of the embodiment of memory test system of FIG. 1.
Figure 4B:
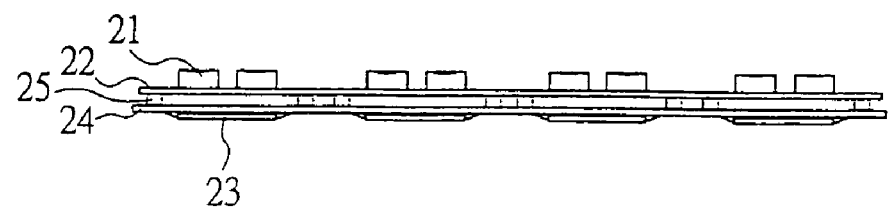
Figure 5A:
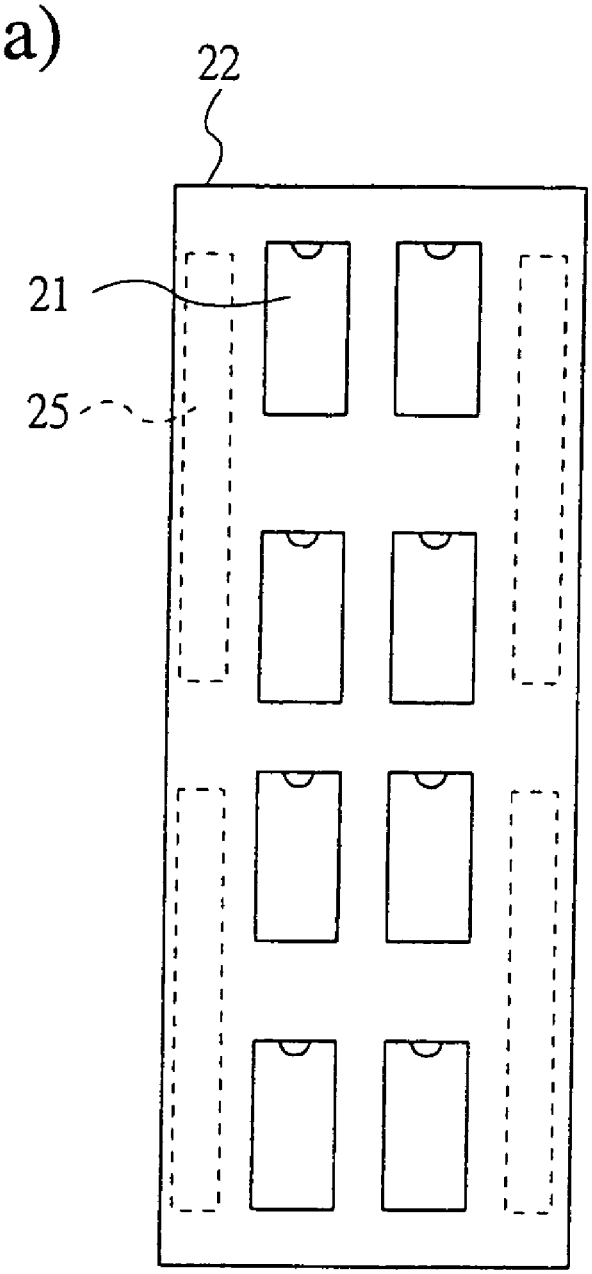
FIG. 5(a) is a schematic plan view and FIG. 5(b) is a schematic lateral view of the socket board of the PFB (for a TSOP) of the embodiment of memory test system of FIG. 1.
Figure 5B:
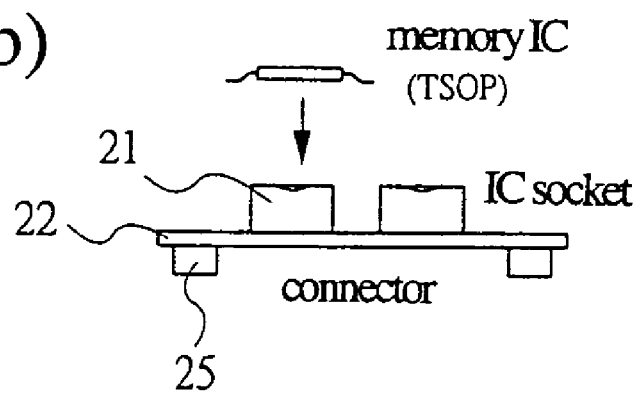
Figure 6A:
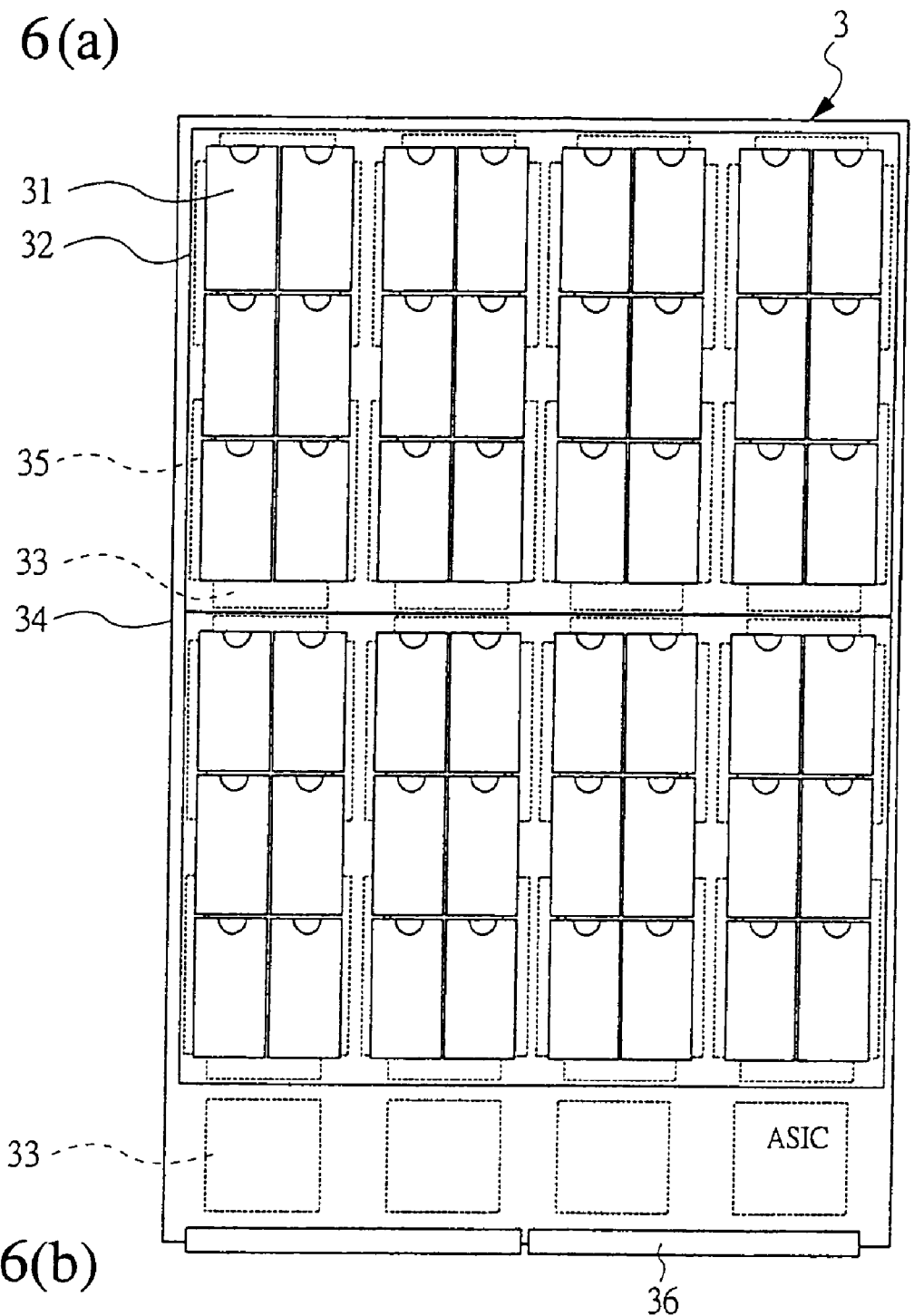
FIG. 6(a) is a schematic plan view and FIG. 6(b) a schematic lateral view of the PFB (for a TCP) of the embodiment of memory test system of FIG. 1.
Figure 6B:
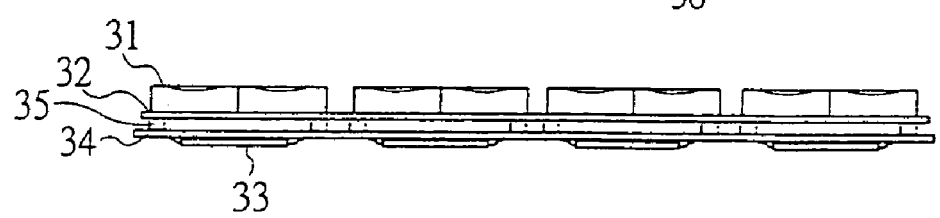

The PFBs 3 are DUTs (devices under test) that are operated in the operating conditions same as those of the memory module in the measurement PC unit 1 to be used as reference so that a number of memories to be observed can be tested simultaneously. FIGS. 4 through 7 show typical PFBs. More specifically, FIGS. 4 and 5 show PFBs 3 for TSOPs (thin small outline packages) to be observed, while FIGS. 6 and 7 show PFBs 3 for TCPs (tape carrier packages) to be observed. In FIGS. 4 and 6, (a) is a schematic overall plan view and (b) is a schematic overall lateral view, whereas, in FIGS. 5 and 7, (a) schematic plan view and (b) is a schematic lateral view of the socket board of the PFBs.

Referring now to FIGS. 4 and 5, the PFBs 3 for TSOPs (memory ICs) to be observed comprise two kinds of boards, one of which are a plurality of (eight in FIG. 4) socket boards 22, each carrying a plurality of (eight in FIG. 4) IC sockets 21 on the main surface thereof that are mounted by respective (eight) TSOPs, the other of which is a mother board 24 carrying a plurality of ASICs 23 (application specific integrated circuits) 23 to be used for distributing a signal and comparing and judging the performance of the TSOPs on the main surface thereof. The eight socket boards 22 and the single mother board 24 are connected to each other by way of connectors 25 arranged on the rear surfaces of the socket boards 22. The PFBs 3 having the configuration as shown in FIG. 4 are mutually connected by way of connectors 26. A total of up to sixteen PFBs 3 can be contained in the constant temperature tank 7 so that a total of up to (8×8×16)=1024 TSOPs can be observed simultaneously.

Now, referring to FIGS. 6 and 7, the PFBs 3 for TCPs (memory ICs) to be observed also comprise two kinds of boards, one of which are a plurality of (eight in FIG. 6) socket boards 32, each carrying a plurality of (six in FIG. 4) IC sockets 31 on the main surface thereof that are to be mounted with respective TCPS, and the other of which is a mother board 34 carrying, on the main surface thereof, a plurality of (twenty eight) ASICs 33 to be used for distributing a signal and comparing and judging the performance of the TCPs. The eight socket boards 32 and the single mother board 34 are connected to each other by way of connectors 35 arranged on the respective rear surfaces of the boards. The PFBs 3 having the configuration as shown in FIG. 6 are mutually connected by way of connectors 36. A total of up to sixteen PFBs 3 can be contained in the constant temperature tank 7 so that a total of up to (6×8×16)=768 TCPs can be observed simultaneously.

The display panel 4 operates to display the current status of the test that is being conducted and the operating conditions of the measurement PC unit 1 in such a way that the testing operator can visually recognize them.

The power source 5 produces the voltage necessary for driving the PC tester. More specifically, it is used to drive the respective internal component units of the PC tester. Additionally, different tests can be conducted by varying the voltage produced by the power source 5.

The control PC 6 contains in it a control substrate for controlling the selection of test parameters and various analytical operations so that the start and the end of each test is also controlled by the control substrate.

Now, the signaling system of the PC tester having the above described configuration will be described by referring to FIG. 8. As shown in FIG. 8, the signaling system of the PC tester comprises a signal drawing-out substrate 41 for taking out a signal from the memory module 13 in the measurement PC unit 1 and buffering it; a control substrate 42 contained in the control PC 6 and adapted to output a control signal for the start or the end of a test; two-stage distribution substrates 43 (one board on the first stage and three boards on the second stage) contained in the signal distribution unit 2 and adapted to distribute the signal buffered by the signal drawing-out substrate 41; and a plurality of (sixteen in FIG. 8) PFBs 3 to which the signal is distributed by the distribution substrates 43. The voltage necessary to drive the PFBs 3 is supplied from the power source 5.

FIG. 9 shows an operation of the signaling system in a testing operation using the PC tester. Referring to FIG. 9, the signal drawing out substrate 41 draws out a signal from the memory module 13 arranged on the PC mother board 11 in the measurement PC unit 1 and buffers it. The buffered signal is then distributed by the first stage and second stage distribution substrates 43 having flip-flop circuits (F/Fs) 51 for pipeline data transfer and a distribution circuit 52. The distributed signal is then sent to the PFBs, each comprising flip-flop circuits (F/Fs) 53 for pipeline data transfer, a command analysis/application control (R/W) circuit 54, a judgment circuit 55 and a judgment result output register (P/F: pass/fail) 56, which PFBs then test the memories 57 to be observed such as TSOPs or TCPs that are mounted on the IC sockets 21 or 31, whichever appropriate. Signals such as an address signal, a clock signal, a control signal and so on are applied to the memories 57 to be observed by the corresponding PFB 3, which is by turn adapted to exchange data and other signals with the memories 57 to be observed. A pass/fail signal is taken out from the register 56 of the PFB 3 to show the result of the test.

Data can be transferred at high speed for the above signaling system by means of a pipeline system, which is a system for synchronizing signals, while latching data among circuits by means of the flip-flop circuits 51, 53, and transferring them at high speed. The frequency of exchanging clock signals between the flip-flop circuits 51, 53 needs to be higher than the rate of signal transmission. The clock signal of the memory module 13 to be used as reference such as that of the SD-RAMs (synchronous dynamic random access memories) of a DIMM (dual in-line memory module) is typically used for the purpose of the invention. Therefore, the flip-flop circuits for the pipeline are arranged at the input stage and the output stage of each substrate in order to absorb variances that arise to signal transmission.

With the pipeline system, as shown in FIG. 10 (timing chart for the operations indicated respectively by (1) through (4) in FIG. 9), signal n for the operation of the DIMM is delayed by two cycles at the outputs of the first stage distribution substrate 43, also by two cycles at the outputs of the second stage distribution substrates 43 and then by two cycles relative to the memories 57 to be observed so that it is delayed by six cycles for transmission from the start of the operation of the DIMM to time of the application thereof to the memories 57 to be observed. While the signal n is delayed by six cycles for the memories 57 to be observed of the first stage, it is delayed further for the memories 57 to be observed of the second stage for the purpose of reducing the power consumption rate at peak periods. Therefore, with the pipeline operation system, the cycle of operation is temporally shifted relative to the operation of the DIMM during the test. Thus, while the cycle of operation of the memories 57 to be observed is delayed from that of the DIMM to be used as reference by a time corresponding to the number of stages of the pipeline, the speed and pattern of operation in the same condition as the DIMM to be used as reference can be maintained.

During the test, a signal is taken out from the DIMM 61 that is the memory module mounted on the PC mother board 11 as shown in FIG. 11, which schematically illustrates the signal drawing out method to be used when testing alone a memory by the embodiment of memory test system. Referring to FIG. 11, the signal sent from the chip set LSI 15 to the DIMM 61 is taken out from a selected one of the SD-RAMs 62, which are memory ICs, on the DIMM 61 in order to conduct the test in conditions same as the actual operating conditions. As shown in FIG. 11, a wire is soldered to the selected SD-RAM 62 and the signal is directly drawn out of the SD-RAM 62 and quickly buffered by the signal drawing-out substrate 41. With this technique of drawing out the signal, the influence of degradation of the signal waveform and that of reflection to the original SD-RAM 62 can be minimized.

Figure 12:
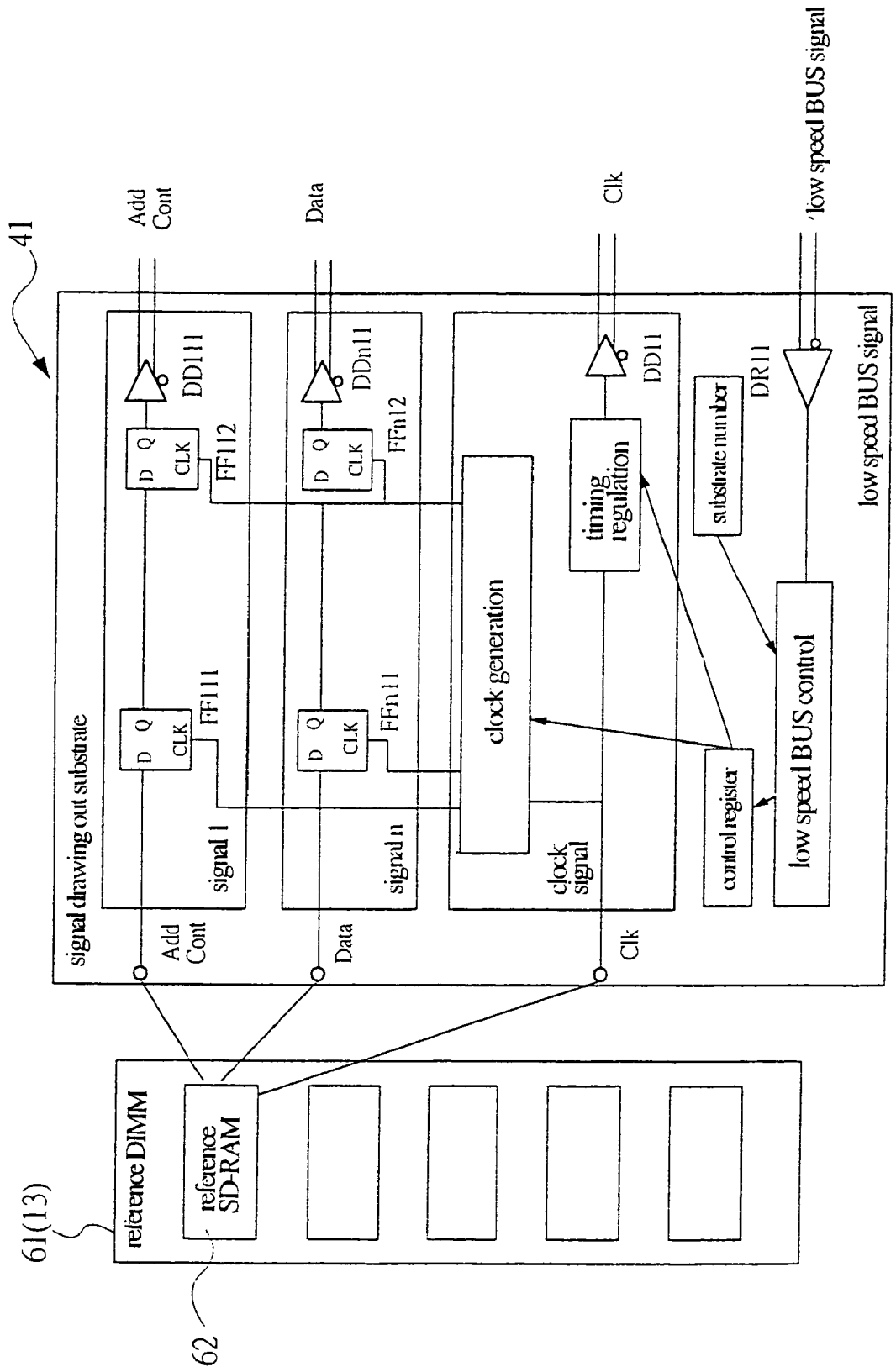
FIG. 12 is a schematic block diagram of the signal drawing out substrate of the embodiment of memory test system of FIG. 1.
Figure 13:
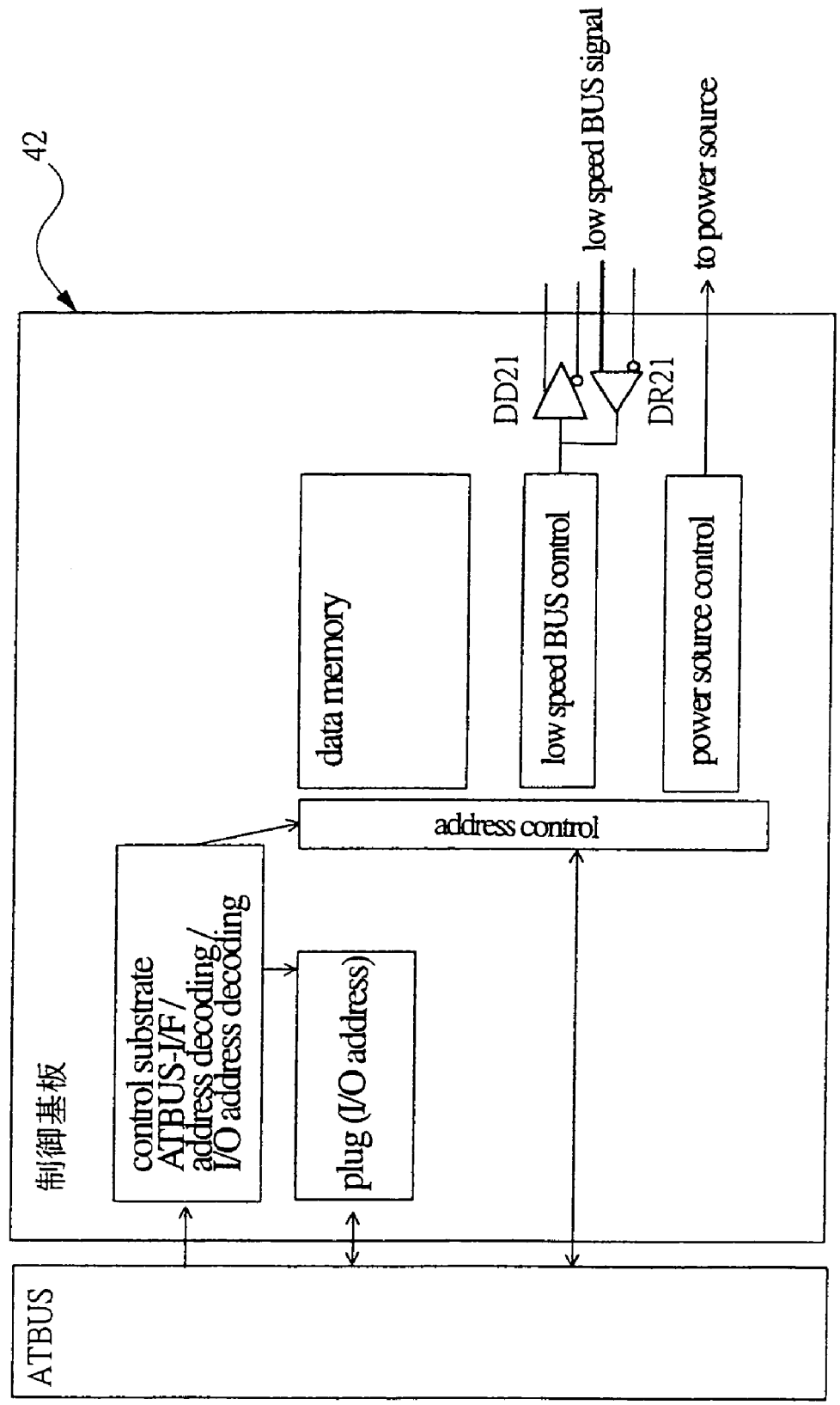
FIG. 13 is a schematic block diagram of the control substrate of the embodiment of memory test system of FIG. 1.
Figure 14:
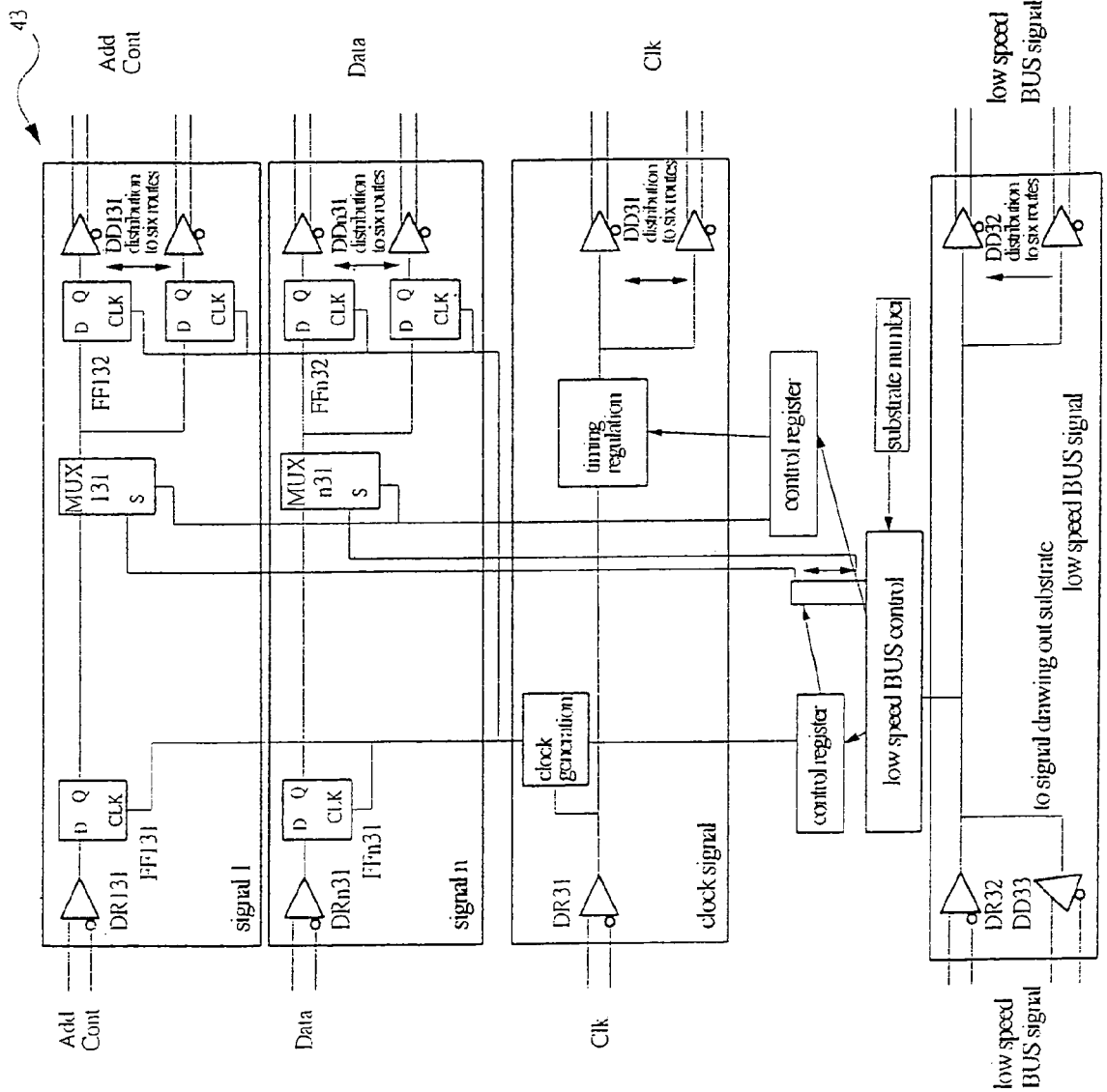
FIG. 14 is a schematic block diagram of the distribution substrate of the embodiment of memory test system of FIG. 1.

Now, the functional blocks of the substrates of the signaling system of the PC tester shown in FIGS. 8 and 9 will be described in detail by referring to FIGS. 12 through 16. FIGS. 12 through 14 respectively illustrate the functional blocks of the signal drawing out substrate 41, the control substrate 42 and the distribution substrate 43, whereas FIGS. 15 and 16 schematically illustrates the functional block of the PFBs 3. More specifically, FIG. 15 shows the distribution sections of the PFBs 3 and FIG. 16 shows the socket sections (for two sockets) of the PFBs 3.

As shown in FIG. 12, the signal drawing-out substrate 41 is adapted to receive the signal taken out from the selected SD-RAM 62 on the DIMM 61 to be used as reference on the PC mother board 11 of the measurement PC 8 at the input terminal thereof and typically process address signal Add, control signal Cont and data signal Data at signal blocks 1 through n and clock signal Clk at a clock signal block before outputting the processed signals through the respective output terminals.

The signal blocks 1 through 1 for the address signal Add, the control signal Cont and the data signal Data comprises respective flip-flop circuits FF111 through FFn11 and FF112 through FFn12 arranged at the input stages and the output stages for the purpose of pipeline data transfer and differential drivers DD111 through DDn11. The address signal Add, the control signal Cont and the data signal Data that are input are then latched by the flip-flop circuits FF111 through FFn11 and FF112 through FFn12 in synchronism with the reference clock signal and the variances, if any, among the signal blocks are corrected and synchronized before they are output as proper/inverted signals by way of the differential drivers DD111 through DDn11.

The clock signal block for the clock signal Clk comprises a clock generating circuit for waveform shaping; a timing regulating circuit for timing regulation; and a differential driver D11. The input clock signal Clk is shaped in terms of waveform by the clock generating circuit and made to become reference clock signal for the flip-flop circuits FF111 through FFn11 and FF112 through FFn12 of said signal blocks 1 through n. At this time, it is delayed by several cycles from the signal of the DIMM 61 to be used as reference. Additionally, the clock signal Clk is regulated in terms of timing by the timing regulating circuit and synchronized with the operation of said signal blocks 1 through n before it is output as proper/inverted clock signal by way of the differential driver DD11.

The signal drawing-out substrate 41 is provided with a differential receiver DR11 for receiving a low speed BUS (bus) signal as input, a low speed BUS control signal and a control register. As the low speed BUS signal is input from the control PC 6 by way of the distribution substrates 43, it is received by the differential receiver DR11 and applied to the clock generating circuit and the timing regulating circuit of the clock signal block by way of the low speed BUS control circuit and the control register for the purpose of timing regulation. The substrate numbers are also supplied to the low speed BUS control circuit.

As shown in FIG. 13, the control circuit 42 is connected to AT (asynchronous transfer) BUS of the control PC 6 and comprises an ATBUS-I/F (interface)/address decode/I/O (input/output) address decode circuit, a flag circuit (I/O address); an address control circuit; a data memory; a low BUS control circuit; a power source control circuit; a differential driver DD21; and a differential receiver DR21.

An address signal is input to the ATBUS-I/F (interface)/address decode/I/O (input/output) address decode circuit by way of ATBUS and the flag circuit and the address control circuit can exchange signals with ATBUS.

The address signal input to the ATBUS-I/F (interface)/address decode/I/O (input/output) address decode circuit is decoded and the address control circuit controls read/write operations relative to the data memory according to the decoded address signal. The low speed BUS control circuit outputs a low speed BUS signal by way of the differential driver DD 21 for the purpose of timing regulation of the reference clock signal at the signal drawing out substrate 41 and the distribution substrates 43, and receives another low speed BUS signal containing a judgment signal representing the result of judgment from the PFBs by way of the differential receiver DR21 in order to determine pass/fail of each memory 57 to be observed. The low speed BUS signal is used as interrupt signal for controlling the analysis function at the time of self-diagnosis and debugging. Additionally, a power source ON/OFF signal is output from the power source control circuit to the power source.

As shown in FIG. 14, the distribution substrates 43 receive address signal Add, control signal Cont, data signal Data and clock signal Clk from the signal drawing out substrate 41 by way of the input terminals and receive a low speed BUS signal from the control substrate 42 also by way of the input terminals. The address signal Add, the control signal Cont and the data signal Data are processed in the signal blocks 1 through n and the clock signal Clk is processed in the clock signal block, whereas the low speed BUS signal is processed in the low speed BUS block before they are output through the respective output terminals.

The signal blocks 1 through n for processing the address signal Add, the control signal Cont and the data signal Data respectively comprise differential receivers DR131 through DRn31 arranged at the input stage; flip-flop circuits FF131 through FFn31 also arranged at the input stage for the purpose of pipeline data transfer; multiplexers MUX131 through MUXn31 for switching from the normal operation to the operation of the low speed BUS signal or vice versa; a plurality (six in FIG. 14) of flip-flop circuits FF132 through FFn32 arranged at the output stage and adapted to both transfer and distribute data by means of the pipeline system; and a plurality of (six in FIG. 14) differential drivers DD131 through DDn31 arranged at the output stage. As the address signal Add, the control signal Cont and the data signal Data are input by way of the differential receivers DR131 through DRn31, they are latched by the flip-flop circuits FF131 through FFn31 at the input stage in synchronism with the reference clock signal, selected by the multiplexers MUX131 through MUXn31 and latched again by the flip-flop circuits FF132 through FFn32 at the output stage in synchronism with the reference clock signal. Then, the variances of the signals among the signal blocks as well as among distributions in the respective signal block are corrected and the signals are synchronized before they are output as proper/inverted signals by way of the differential drivers DD131 through DDn31. Note that the signals are distributed to the six differential drivers of the respective signal blocks.

The clock signal block for the clock signal Clk comprises a differential receiver DR31 arranged at the input stage; a clock generating circuit for waveform shaping; a timing regulating circuit for timing regulation and a plurality of (six in FIG. 14) differential drivers DD31 arranged at the output stage. As the clock signal Clk is received by the differential receiver DR31, it is shaped in terms of waveform by the clock generating circuit and made to become reference clock signal for the flip-flop circuits FF131 through FFn31 and FF132 through FFn32 of said signal blocks 1 through n. Additionally, the clock signal Clk is regulated in terms of timing by the timing regulating circuit and synchronized with the operation of said signal blocks 1 through n before it is output as proper/inverted clock signal distributed in six routes by way of the differential drivers DD31.

The low speed BUS signal block for the low speed BUS signal comprises a differential receiver DR32 arranged at the input stage; a plurality of (six in FIG. 14) differential drivers DD32 arranged at the output stage; and a differential driver DD33 for outputting signals to the signal drawing-out substrate 41. As the input low speed BUS signal is received by the differential receiver DR32, it is output as proper/inverted low BUS signal distributed in six routes by way of the differential drivers DD32. Further, the low BUS proper/inverted signal is also output to the signal drawing-out substrate 41 by way of the differential driver DD33.

The distribution substrates 43 additionally comprise a low speed BUS control circuit adapted to receive a low speed BUS signal as input and a pair of control registers. As the low speed BUS signal is input from the control substrate 42, it is sent to the clock generating circuit of the clock signal block by way of one of the control register and used to regulate the reference clock signal in terms of timing while it is also sent to the timing regulating circuit for timing regulation by way of the other register. It is also possible to use the multiplexers MUX131 through MUXn31 of the signal blocks 1 through n for switching from the normal operation to the operation of the low speed BUS signal or vice versa. Note that the substrate numbers are also supplied to the low speed BUS control circuit.

The first stage and the second stage of the above described distribution substrates 43 have a similar circuit configuration. The signal drawn out from the DIMM 61 to be used as reference by way of the signal drawing out substrate 41 is distributed to the six distribution routes at the first stage and then to the six distribution routes of the paired distribution substrates of the second stage and to the four distribution routes of the single distribution substrate of the second stage. Thus, with the pipeline system, it is possible to distribute the input signal to a total of sixteen different routes before it gets to the PFBs 3 of the subsequent stage without changing the speed and pattern of operation of the DIMM to be used as reference in order to realize a high speed signal transmission. Note that the distribution substrates 43 also comprise a control circuit for testing signal "Pass" in the distribution circuit.

Now, referring to FIGS. 15 and 16, the address signal Add, the control signal Cont, the data signal Data and the clock signal Clk are input from the distribution substrates 43 of the second stage to the distributing sections of the PFBs 3 as shown in FIG. 15, and the address signal Add, the control signal Cont and the data signal Data are processed in the signal blocks 1 through n, while the clock signal Clk is processed in the clock signal block before they are output to the respective socket sections of the PFBs 3.

The signal blocks 1 through n for processing the address signal Add, the control signal Cont and the data signal Data respectively comprise differential receivers DR141 through DRn41 arranged at the input stage; flip-flop circuits FF141 through FFn41 for pipeline data transfer also arranged at the input stage; and a plurality of (four in FIG. 15) drivers D141 through Dn41 to be used for distribution. As the address signal Add, the control signal Cont, the data signal Data are received by the differential receivers DR141 through DRn41 as input signals, they are latched by the flip-flop circuits FF141 through FFn41 of the input stage in synchronism with the reference clock signal and output through the drivers D141 through Dn41. Note that the output signals are distributed to the four differential drivers of the signal blocks.

The clock signal block for processing the clock signal Clk comprises a differential receiver DR41 arranged at the input stage; a clock generating circuit for waveform shaping; and a plurality of (four in FIG. 15) drivers to be used for distribution. As the clock signal Clk is received by the differential receiver DR41 as input signal, it is shaped by the clock generating circuit in terms of waveform and turned to reference clock signal for the flip-flop circuits FF141 through FFn41 of the signal blocks 1 through n before it is output through the drivers D41. Note that the clock signal is distributed to the four drivers D41 of the clock signal block.

The distributing section of the PFBs 3 comprises a command analysis/judgment/I/O control circuit adapted to receive the control signal Cont and the reference clock signal as input; a plurality of (four in FIG. 16) drivers D42 for distributing the I/O control signal; and a plurality of (four in FIG. 16) drivers D43 for distributing the judgment signal. The input command is analyzed by the command analysis/judgment/I/O control circuit on the basis of the control signal Cont to generate an I/O control signal for read/writing operation and a judgment signal for starting a judgment operation, of which the I/O control signal is distributed in four routes by way of the drivers D42 and output, while the judgment signal is also distributed in four routes by way of the drivers D43 and output.

The address signal Add, the control signal Cont, the data signal Data, the clock signal Clk, the I/O control signal and the judgment signal output from the distributing section of the PFBs 3 are then input to the socket section (for two sockets) of the PFBs 3 respectively, which will be described hereinafter by referring to FIG. 16. Note that ① through ⑤ shown at the output stage of FIG. 15 and those shown at the input stage of FIG. 16 indicate the connection between the respective signal transmission routes.

As shown in FIG. 16, the address signal Add, the control signal Cont, the data signal Data, the clock signal Clk, the I/O control signal and the judgment signal are input from the distribution section of the PFBs 3 to the socket section (for two sockets) of the PFBs 3 while the low speed BUS signal is input from the distribution substrates 43 of the second stage through the input terminal. Of the input signals, the address signal Add and the control signal Cont are processed by the two distribution blocks of the input system and the data signal Data is processed by the three distribution blocks of the data system, whereas the clock signal Clk, the I/O control signal, the judgment signal and the low speed BUS signal are processed respectively by the clock signal block, the IO control block, the judgment block and the low speed BUS block before they are output through the respective output terminals.

The two distribution blocks of the input system for receiving the address signal Add and the control signal Cont comprise a plurality of (two in FIG. 16) flip-flop circuits FF51 arranged at the output stage for pipeline data transfer and signal distribution; and a plurality of (two in FIG. 16) drivers D51 also arranged at the output stage. The address signal Add and the control signal Cont that are received as input are latched by the flip-flop circuits FF51 in synchronism with the reference clock signal and the variances, if any, of distribution between and in the two distribution blocks of the input system are corrected before they are synchronized and distributed in two routes by way of the two drivers D51. The address signal Add and the control signal Cont distributed to the two drivers D51 are then supplied to the gauge memories (DUT1, DUT2) 57 mounted on the IC sockets 21 on the one hand and to the ASICs 23, 33 of the subsequent step on the other.

The three distribution blocks of the data system for receiving the data signal Data comprise a plurality of (three in FIG. 16) flip-flop circuits FF52 arranged at the output stage for both pipeline data transfer and signal distribution; a plurality of (three in FIG. 16) drivers D52 also arranged at the output stage; a plurality of (two in FIG. 16) receivers R51 arranged at the input stage; a plurality of (three in FIG. 16) switches 51 for isolating the output of the drivers D51; a logic circuit including a plurality of (five in FIG. 16) flip-flop circuits F53 through FF55, a plurality of (two in FIG. 16) exclusive OR gates EXOR51 and a plurality of (two in FIG. 16) OR gates OR51 for comparing the expected value and the observed value (read out data) and judging the observed value for pass/fail, and an expected value delay circuit.

When writing data, the input data signal Data are latched by the flip-flop circuits FF52 in synchronism with the reference clock signal and the variances, if any, of distribution between and in the three distribution blocks of the data system are corrected so that they are synchronized and distributed to the three drivers D52. The data signal Data distributed to the three drivers D52 are then supplied to the gauge memories 57 mounted on the two IC sockets 21 and the ASIC 23, 33 of the subsequent step so as to be written in the gauge memories 57 as written data.

When reading data, the data signal Data read out from the gauge memories 57 mounted on the two IC sockets 21 are received by the receivers R51 and latched by the flip-flop circuits FF53 in synchronism with the reference clock signal, while the data signal Data input simultaneously to make an expected value is delayed by the expected value delay circuit and latched by the flip-flop circuits F55 in synchronism with the reference clock signal. Then, the read out data and the expected value are respectively compared by the exclusive OR gates EXOR51. The signals representing the result of the comparison are subjected to an OR operation at the respective OR gates OR51, using the feedback signals output from the flip-flop circuits FF54 so that ultimately agreement/disagreement signals (agreement: Low, disagreement: High) are latched by the respective flip-flop circuits FF54 and output to the low speed BUS block.

The clock signal block for processing the clock signal Clk comprises a clock timing generating circuit for waveform shaping and, a plurality of (three in FIG. 16) distribution drivers D53. The input clock signal Clk is regulated for waveform by the clock timing generating circuit so as to be used as reference clock signal for the flip-flop circuits FF51, FF52, FF54, FF56 and FF57, which are partly described above and will be partly described hereinafter, and for a strobe monitoring circuit, which will be described hereinafter, and then distributed to three routes by way of the drivers D53. The clock signal Clk distributed to three routes are then supplied to the gauge memories 57 mounted respectively on the paired IC sockets 21 and also to the ASICs 23, 33 of the subsequent step.

The I/O control block for processing the I/O control signal comprises a plurality of (two in FIG. 16) flip-flop circuits FF56 arranged at the output stage and adapted to both pipeline data transfer and distribution; and a driver D54 also arranged at the output stage. As the I/O control signal is input, it is latched by the flip-flop circuits FF56 in synchronism with the reference clock signal and the switch S51 is connected for write operation and disconnected for read operation by the output of one of the flip-flop circuits FF56 while the output of the other flip-flop circuit FF56 is supplied to the ASICs 23, 33 of the subsequent stage by way of the driver D54.

The judgment block for processing the judgment signal also comprises a plurality of (two in FIG. 16) flip-flop circuits FF57 arranged at the output stage and adapted to both pipeline data transfer and distribution; a driver D55 also arranged at the output stage; and a strobe monitoring circuit for the prevention of misjudgment. As the judgment signal is input, it is latched by the flip-flop circuits FF57 in synchronism with the reference clock signal and the output of one of the flip-flop circuits is used as reference clock signal for said flip-flop circuits FF53, FF55 for the purpose of comparing the expected value and the observed value and judging the observed value for pass/fail, the strobe monitoring circuit being used to monitor the judgment signal, whereas the output of the other flip-flop circuit FF57 is supplied to the ASICs 23, 33 of the subsequent step by way of the driver D55. The status signal for starting a judgment operation that is monitored by the strobe monitoring circuit is output to the low speed BUS block.

The low speed BUS block for processing the low speed Bus signal comprises a low speed BUS control circuit and a driver D56. As the low speed BUS signal is input, it is supplied to the ASICs 23, 33 of the subsequent step by way of the low speed BUS control circuit and the driver D56. The low speed BUS control circuit is adapted to receive the agreement/disagreement signal input from the flip-flop circuits FF54 of the three distribution blocks of the data system and receive the status signal for starting a judgment operation input from the strobe monitoring circuit of the judgment block. The reliability of the agreement/disagreement (pass/fail) signal is verified in the read mode.

As described above, the PFBs 3 having a distribution section and a socket section comprise a circuit for distributing the signal from the distribution substrates 43 that is equivalent to the signal of the DIMM 61 to four routes and supplying it to the memories 57 to be observed; and a circuit for analyzing the command representing the status of operation of the SD-RAMs 62 on the basis of the control signal contained in the distributed signal so that they judge for read or write operation and; if the SD-RAMs 62 are being used for write operation, they use the input/output signal as signal to be applied to the memories 57 to be observed; whereas in reading operation they use the input/output signal as signal representing the expected value to be used for the judgment of the input/output signal. The operation of the PFBs are controlled by the hardware. They further comprise a circuit for logically comparing the output signal from each of the memories 57 to be observed and the expected value at the judgment circuit; and a circuit for judging for pass/fail. The above circuits are used to constitute the ASICs 23, 33 on the basis of a unit of 2 duts and signals are transmitted to 2 duts of the ASICs 23, 33 of the subsequent stage by means of the chain system so that a chain is adapted to accommodate 16 duts. In this way, a PFB can observe a total of 64 duts, or 16 duts×16 distribution routes, simultaneously.

Now, the method of switching read/write operation and judging for pass/fail will be summarily described by referring to FIG. 17. As shown in FIG. 17, signal application control/judgment hardware is formed by the circuits on each substrate, said hardware comprising an address Bit control circuit, a control Bit analysis circuit; a data Bit control circuit; a signal application/judgment switching circuit; and a judgment control circuit. The SD-RAMs 62 on the DIMM 61 are controlled by address, input/output data and control signals as described above and the data input/output operation is controlled by a control signal.

Therefore, a circuit for analyzing the above control operations is installed. The address signal is supplied to the memories 57 to be observed by way of the address Bit control circuit and the control signal is supplied to the memories 57 to be observed by way of the control Bit control circuit, while (1) the control signal transmitted from the SD-RAMs of the DIMM 61 to be used as reference is analyzed by the control Bit analysis circuit to recognize any data input/output. (2) Then the application of data to or the output of data from the memories 57 to be observed is selected by the application/judgment switching circuit corresponding to the data input/output. In the write mode, the data transmitted from the SD-RAMs 62 of the DIMM 61 to be used as reference is written to the memories 57 to be observed by way of the data Bit control circuit and the application/judgment switching circuit. (3) In the read mode, on the other hand, the signal from the SD-RAMs 62 is received from the data Bit control circuit as expected value, and the judgment control circuit compares the expected value and the data read out from the memories 57 to be observed by way of the application/judgment switching circuit in order to judge if the memories 57 to be observed output signals that are equivalent to that of the DIMM 61 to be used as reference.

The operation of the signaling system when testing memory modules in place of single memories as described above by referring to FIG. 9 will be now discussed below by referring to FIG. 18. As shown in FIG. 18, the signal of the DIMM 61 mounted on the PC mother board 11 in the measurement PC unit 1 is taken out and buffered by means of the signal drawing out substrate 41. The buffered signal is then distributed by means of the distribution substrates 43 having flip-flop circuits and distribution circuits for pipeline data transfer. The distributed signal is then transmitted to the PFBs 3 having flip-flop circuits for pipeline data transfer and command analysis, signal control and data comparison/judgment circuits and the memory modules 71 to be observed such as DIMMs on the PFBs 3 are tested. Signals such as an address signal and a clock signal can be applied to the memory modules 71 to be observed by the PFBs 3, which are adapted to exchange data. The result of the observation is taken out from the PFBs 3 to the control PC 6 by the control IF pass/fail read circuit.

For a test, the signals of the DIMM 61 mounted on the PC mother board 11 as shown in FIG. 19 is taken out. As in the case of testing single memories, signals are taken out from the DIMM 61 from the chip set LSI15 in order to produce the operating conditions. As shown in FIG. 19, all the signals of the DIMM 61 are take out by way of wires and immediately buffered by the signal drawing out substrate 41. With this method of taking out signals, the influence of degradation of the signal waveform and that of reflection to the original DIMM 61 can be minimized.

As described above, when memory modules are selected as objects of test in place of single memories, all the signals that are input to and output from each module are controlled for observation, disregarding 1 dut of the memory to be used as reference. Therefore, while the unit to be used for the judgment of pass/fail is shifted from a memory to a module, the same control techniques and the same hardware configuration can be used. It is also possible to identify any defective memories in a memory module by controlling the operating conditions of the DIM 61 to be used as reference and controlling the memories of the memory module on a memory by memory basis (by assigning I/O) so that a specific memory may be exclusively tested.

Now, the flow of the operation of testing a memory chip, a unit product (in the form of a package) or a memory module will be described by referring to FIG. 20. For the test process, single memories 57 to be observed such as TSOPs or TCPs are mounted on the IC sockets 21 of the PFBs 3 as described above while memory modules 71 to be observed such as DIMMs are used with PFBs 3 provided with sockets for receiving modules.

Firstly, a wafer carrying a plurality of memory circuits as chips is brought in and a probe test (P test) is conducted to test the electric characteristics of the memory circuits on the wafer. The defective chips, if any, as detected by the probe test are remedied and relieved by using redundant memory cells and/or signal lines (Steps S101 through S103).

Then, after dicing the wafer to produce isolated chips and assembling them to so may unit packages, they are treated in a burn-in (B/I) step where a rated voltage or a voltage higher than the rated voltage is applied to each memory to be observed at predetermined temperature so that the packages are screened while a signal is being applied to the memory circuits in quasi-operating conditions (Step S104).

Subsequently, the individual memories are tested by means of the PC tester of this embodiment (Steps S105, S106). In this test step, the memories are subjected to a long test where the memory circuits are typically disturbed by using a frequency longer than the ordinary frequency, and a function test where the memories are tested for their functions by driving them for read/write operations, using a predetermined test pattern to confirm that they properly operate.

Thereafter, the memories are tested firstly in a DC test step for open/short test between the input terminal and the output terminal, leak current test and source current test (in operation and in the stand-by state) by using an ordinary memory tester and then in a timing test step for AC timings including setup and hold when exchanging signals with the chip set LSI 15 (Steps S107, S108). After the completion of this test step, individual packages that are judged to be good can be shipped as products (Step S109).

The above steps are applicable not only to individual products in the form of packages as described above but also to memory chips that are produced by dicing a wafer or even those that are still in the form of a wafer that is to be diced so that good memory chips may be shipped after the test steps. It will be appreciated that the operation of assembling memory chips into a package can be eliminated before the burn-in process if the memory chips are tested per se. If, on the other hand, memory chips are tested in the form of a wafer, the steps from the burn-in process are followed and the wafer is diced into memory chips after the timing test.

Additionally, a plurality of memory chips that are judged to be good may be mounted on a module substrate to produce a memory module such as a DIMM, which is then subjected to a simple test conducted to find it as good or no good so that it may be shipped as memory module product if it is found to be a good one (Steps S110 through 112). It may be needless to say that a plurality of memory chips are assembled into a memory module for shipment.

Thus, while, conventionally, memory chips that come out of a burn-in process are subsequently subjected to a series of tests including a long test, a DC test, a function test and a timing test and assembled into modules, which are then screened typically by using a PC before shipment, with the above described embodiment, memory chips are tested by a PC tester according to the invention for a long test and a function test before a DC test and a timing test that are conducted by means of an ordinary memory tester in a conventional way. Thus, this embodiment can reduce the time required for the test using a memory tester by half. Additionally, a PC tester according to the invention can test a large number of (k) memory chips simultaneously if compared with a conventions tester that can test only 64 memory chips at a time so that the present invention can remarkably reduce the overall test time.

Now, the operation of mounting a memory module on a PC will be briefly described by referring to the flow chart of FIG. 21. The manufacturer of individual memory chips carries out a screening test by using a PC tester on products that may be in the form packages or memory chips and good ones obtained as a result of the screening test are shipped as good ones (Steps S201, S202). Thus, the manufacturer of individual memory chips utilizes the embodiment of PC tester for the screening test.

Subsequently, the module assembler carries out a receiving test on the packages or the memory chips shipped from the manufacturer of individual memory chips (Step S203) and then sends them to the assembly line. On the assembly line, a pattern is printed on a module substrate by using creamy solder and memory chips or packages are mounted thereon along with other components before they are thermally treated by reflowing in order to electrically connect the module substrate and the components on it (Steps S204 through S206). Thereafter, the memory module is tested for appearance and marks are applied to it before it is subjected to a screening test for finding it is good or no good so that, if it is found to be a good one, it may be shipped as memory module product (Steps S207 through S210). The module assembler utilizes the embodiment of PC tester for the receiving test and/or the screening test.

Then, the PC manufacturer carries out a receiving test on the memory modules shipped from the module assembler and mounts them on PC products (Steps S211, S212). In this mounting process, the PC manufacturer carriers out a test on the PC products so that the PC products that have passed the test can be shipped as final products (Steps S213, S214). Thus, the PC manufacturer utilizes the embodiment of PC tester for the receiving test.

Thus, the above described embodiment of PC tester comprises a measurement PC unit 1 that carries a memory module to be used as reference; a signal distribution unit 2 for distributing the signal taken out of the devices PC8 to be observed; a plurality of PFBs 3 mounted by respective objects of observation to be observed simultaneously by using the signal distributed by the signal distribution unit 2; and a control PC 6 for controlling the selection of test parameters and various analytical operations, and the use of the PC tester provides the following advantages:

(1) The objects of observation that may be memory chips, TSOPs or TCP having a package structure and comprising memory chips, memory modules such as DIMMs having a module structure and comprising such packages, memory module having a module structure and comprising memory chips or PCs mounted by memory modules can be can be tested in quasi-operating conditions that are very close to the actual operating conditions.

(2) It is possible to realized a high performance PC tester at low cost by utilizing a measurement PC unit 1 mounted by a memory module to be used as reference that may be a DIMM 61.

(3) Memory chips, unit products, memory modules and PCs can be tested by means of a same test apparatus.

(4) As to personal computers expected to have only a short service life because of early model changes, it is possible to handle it simply by selectively using a measurement PC 8 in a measurement PC unit 1.

(5) It is possible to test PCs in quasi-operating conditions, including the performance of the related peripheral circuits of the personal computer on which it is to be mounted and the influence of processing operations of the PC using programs that could hitherto give rise to problems when mounting it on the PC.

(6) A number of memory chips, unit products, memory modules or personal computers can be tested simultaneously by using a plurality of PFBs 3.

(7) Since the PC tester can be applied to the step of sorting memory chips, unit products or memory modules, the step of carrying out an acceptance test on memory chips or unit products and/or the step of carrying out an acceptance inspection on memory modules, the high speed tester that has hitherto been used for them can be replaced by a test apparatus according to the invention to reduce the investment for the test, the inspection and the manufacturing equipment.

(8) Since products to be tested can be sorted under quasi-operating conditions, it is possible to improve the quality of memory chips, unit products, memory modules and personal computers.

While the invention of the inventor is described above in terms of a specific embodiment, the present invention is by no means limited to the above embodiment, which may be modified and altered in various different ways without departing from the scope of the invention.

For example, while the above embodiment is described in terms of packages such as TSOPs or TCPs and memory modules such as DIMMs, the present invention is not limited thereto and may be equally applied to packages such as TQFPs (thin quad flat packages) and modules such as SIMMs (single in-line memory modules).

While the control circuit comprises ASICs in the above embodiment, the present invention is by no means limited thereto and they may be replaced by field programmable ICs such as FPGAs. In other words, ASICs may include field programmable ICs.

Additionally, the present invention can effectively be used not only for SD-RAMs but also other memory products such as DRAMs and flash memories. Furthermore, the present invention can be applied to logic products comprising microcomputers and/or ASICs (including FPGAs).

The number of distribution substrates and that of PFBs are not limited to the above description and any appropriate number may be used depending on the number of products to be tested simultaneously.

Finally, while the present invention is described in terms of personal computers, the present invention is by no means limited thereto and can equally be applied to information processing apparatus and electric home appliances having an information processing feature that are equipped with some other computer, a CPU, memories and/or a control circuit and adapted to control the CPU and the memories by means of the control circuit.

What is claimed is:

1. A method of testing a memory device comprising:
   a step of mounting a reference memory device on a first board on which a data processing unit is mounted;
   a step of supplying a test memory device and the reference memory device with a testing signal; and
   a step of verifying a relationship between a reference output signal from the reference memory device and an output signal from the test memory device, in response to the testing signal input to the memory devices, wherein:
a plurality of testing signals supplied to the reference memory device are transferred by each of the plurality of testing signals which are synchronized to a clock used for a plurality of flip flops.

2. A method of testing a memory device comprising:
a step of mounting a reference memory device on a first board on which a data processing unit is mounted;
a step of supplying a test memory device and the reference memory device with a testing signal; and
a step of verifying a relationship between a reference output signal from the reference memory device and an output signal from the test memory device, in response to the testing signal input to the memory devices, wherein:
a plurality of the test memory devices are to be tested and a plurality of the testing signals are supplied in parallel to the plurality of test memory devices, and
wherein a plurality of the testing signals supplied in parallel to the plurality of test memory devices are transferred by each of the plurality of testing signals which are synchronized to a clock used for a plurality of flip flops.

3. The method of testing a memory device according to claim 2, wherein:
the plurality of testing signals is supplied in parallel to the plurality of test memory devices by the plurality of testing signals which are distributed in a plurality of stages.

4. An apparatus for testing a memory device, the apparatus comprising:
a socket to be mounted with a test memory device;
an input unit supplied with a testing signal and a reference output signal output from a reference memory device;
a control section for determining a relationship between the reference output signal from the reference memory device and an output signal from the test memory device, in response to the testing signal being input to the test memory device, wherein the testing signal is output from a data processing unit which is mounted on a first board with the reference memory device;
a second board including the socket to be mounted with the test memory device; and
a third board adapted to coupling to a plurality of the second board,
wherein the third board is arranged to distribute the testing signal to the reference memory device, and to supply each of a plurality of the testing signals to each of a plurality of the test memory devices.

5. The apparatus for testing a memory device according to claim 4, further comprising a plurality of types of the second boards to accommodate the test memory device.

6. An apparatus for testing a memory device, the apparatus comprising:
a socket to be mounted with a test memory device;
an input unit supplied with a testing signal and a reference output signal output from a reference memory device; and
a control section for determining a relationship between the reference output signal from the reference memory device and an output signal from the test memory device, in response to the testing signal being input to the test memory device,
wherein the testing signal is output from a data processing unit which is mounted on a first board with the reference memory device, and
wherein the first board comprises a substrate for taking out the reference output signal from the reference memory device and supplying the input unit with the reference output signal.

7. A method of manufacturing a memory module comprising:
a step of preparing a test memory device;
a step of mounting a reference memory device on a first board on which a data processing unit is mounted;
a step of supplying the test memory device and the reference memory device with a testing signal;
a step of verifying a relationship between a reference output signal from the reference memory device and an output signal from the test memory device, in response to the testing signal input to the memory devices; and
a step of forming the memory module by mounting the memory device verified in connection with the relationship in the verifying step on a substrate.

8. The method of manufacturing a memory module according to claim 7, wherein:
a plurality of the test memory devices are prepared and a plurality of the testing signals to be supplied to the reference memory device are supplied in parallel to the plurality of test memory devices.

9. The method of manufacturing a memory module according to claim 8, wherein: a plurality of semiconductor chips for verifying the relationship are used in the method, and a number of the semiconductor chips corresponds to a number of the test memory devices.

10. The method of manufacturing a memory module according to claims 7, wherein:
the data processing unit is coupled to the reference memory device and the first board has a control circuit for controlling an operation of the memory module.

11. The method of manufacturing a memory module according to claim 7, wherein:
the verifying step verifies the relationship by determining agreement/disagreement between the reference output signal and the output signal from the test memory device.

12. The method of manufacturing a memory module according to claim 7, wherein:
one of a plurality of testing signals to be supplied to the reference memory device is an address signal, one of the plurality of testing signals to be supplied to the reference memory device is a data signal, one of the plurality of testing signals to be supplied to the reference memory device is a clock signal, and one of the plurality of testing signals to be supplied to the reference memory device is a control signal.

13. A method of manufacturing a DIMM comprising:
a step of preparing a test memory device;
a step of mounting a reference memory device on a first board on which a data processing unit is mounted;
a step of supplying the test memory device and the reference memory device with a testing signal;
a step of verifying a relationship between a reference output signal from the reference memory device and an output signal from the test memory device, in response to the testing signal input to the memory devices;
and a step of forming the DIMM by mounting the test memory device verified in connection with the relationship in the preceding step on a substrate.

* * * * *